United States Patent
Alptekin et al.

(10) Patent No.: US 9,515,168 B2
(45) Date of Patent: Dec. 6, 2016

(54) FIN END SPACER FOR PREVENTING MERGER OF RAISED ACTIVE REGIONS

(71) Applicant: International Business Machines Corporation, Armonk, NY (US)

(72) Inventors: Emre Alptekin, Wappingers Falls, NY (US); Sameer H. Jain, Beacon, NY (US); Viraj Y. Sardesai, Poughkeepsie, NY (US); Cung D. Tran, Newburgh, NY (US); Reinaldo A. Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/884,045

(22) Filed: Oct. 15, 2015

(65) Prior Publication Data

US 2016/0035876 A1   Feb. 4, 2016

Related U.S. Application Data

(62) Division of application No. 14/154,206, filed on Jan. 14, 2014, now Pat. No. 9,349,836.

(51) Int. Cl.
*H01L 27/088*   (2006.01)
*H01L 29/66*   (2006.01)
(Continued)

(52) U.S. Cl.
CPC ..... *H01L 29/66795* (2013.01); *H01L 21/0217* (2013.01); *H01L 21/02164* (2013.01);
(Continued)

(58) Field of Classification Search
CPC ................................................ H01L 29/785
(Continued)

(56) References Cited

U.S. PATENT DOCUMENTS

| 6,413,802 B1 | 7/2002 | Hu et al. |
| 7,749,849 B2 | 7/2010 | Hu et al. |

(Continued)

OTHER PUBLICATIONS

Office Action dated Dec. 3, 2015 received in U.S. Appl. No. 14/883,882.

(Continued)

*Primary Examiner* — Sonya D McCall Shepard
(74) *Attorney, Agent, or Firm* — Scully, Scott, Murphy & Presser, P.C.; Steven J. Meyers

(57) ABSTRACT

After formation of gate structures over semiconductor fins and prior to formation of raised active regions, a directional ion beam is employed to form a dielectric material portion on end walls of semiconductor fins that are perpendicular to the lengthwise direction of the semiconductor fins. The angle of the directional ion beam is selected to be with a vertical plane including the lengthwise direction of the semiconductor fins, thereby avoiding formation of the dielectric material portion on lengthwise sidewalls of the semiconductor fins. Selective epitaxy of semiconductor material is performed to grow raised active regions from sidewall surfaces of the semiconductor fins. Optionally, horizontal portions of the dielectric material portion may be removed prior to the selective epitaxy process. Further, the dielectric material portion may optionally be removed after the selective epitaxy process.

15 Claims, 31 Drawing Sheets

(51) Int. Cl.
*H01L 29/78* (2006.01)
*H01L 21/02* (2006.01)
*H01L 21/265* (2006.01)
*H01L 21/311* (2006.01)
*H01L 21/762* (2006.01)
*H01L 29/06* (2006.01)
*H01L 29/08* (2006.01)
*H01L 29/417* (2006.01)

(52) U.S. Cl.
CPC .. *H01L 21/02238* (2013.01); *H01L 21/02247* (2013.01); *H01L 21/02252* (2013.01); *H01L 21/02274* (2013.01); *H01L 21/26566* (2013.01); *H01L 21/31111* (2013.01); *H01L 21/762* (2013.01); *H01L 29/0653* (2013.01); *H01L 29/0847* (2013.01); *H01L 29/41783* (2013.01); *H01L 29/41791* (2013.01); *H01L 29/785* (2013.01); *H01L 29/7848* (2013.01)

(58) Field of Classification Search
USPC .......................................... 257/347; 438/294
See application file for complete search history.

(56) References Cited

U.S. PATENT DOCUMENTS

| | | |
|---|---|---|
| 2001/0010835 A1 | 8/2001 | Akizuki et al. |
| 2002/0014407 A1 | 2/2002 | Allen et al. |
| 2013/0292805 A1 | 11/2013 | Cai |
| 2014/0048881 A1* | 2/2014 | Kanike ............. H01L 29/66545 257/347 |
| 2015/0060997 A1* | 3/2015 | Basu .................... H01L 29/785 257/330 |
| 2015/0102411 A1 | 4/2015 | Ching et al. |
| 2015/0187944 A1* | 7/2015 | Ching ................ H01L 29/7851 257/190 |

OTHER PUBLICATIONS

Office Action dated Dec. 18, 2015 received in U.S. Appl. No. 14/154,206.

* cited by examiner

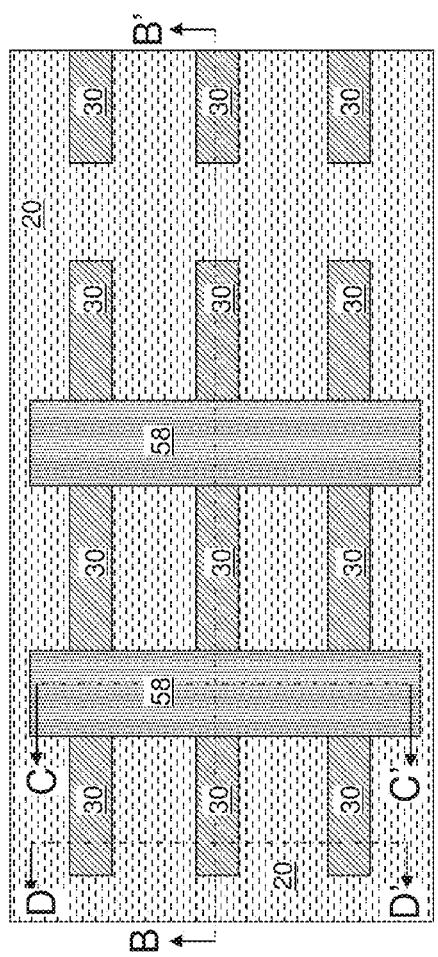
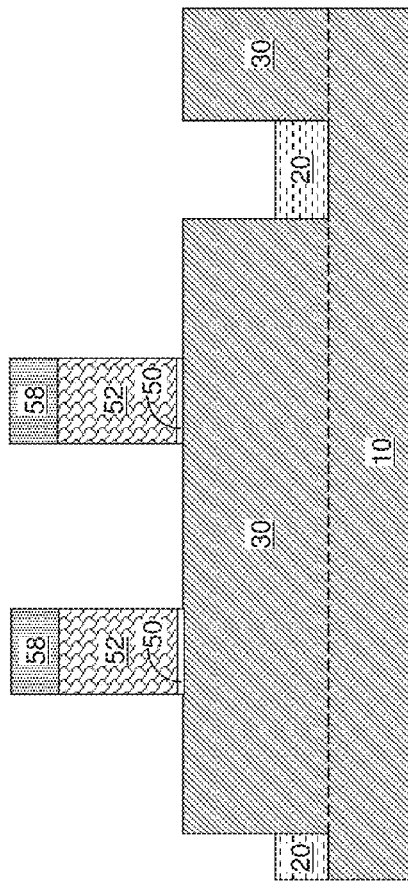
FIG. 2A
FIG. 2B

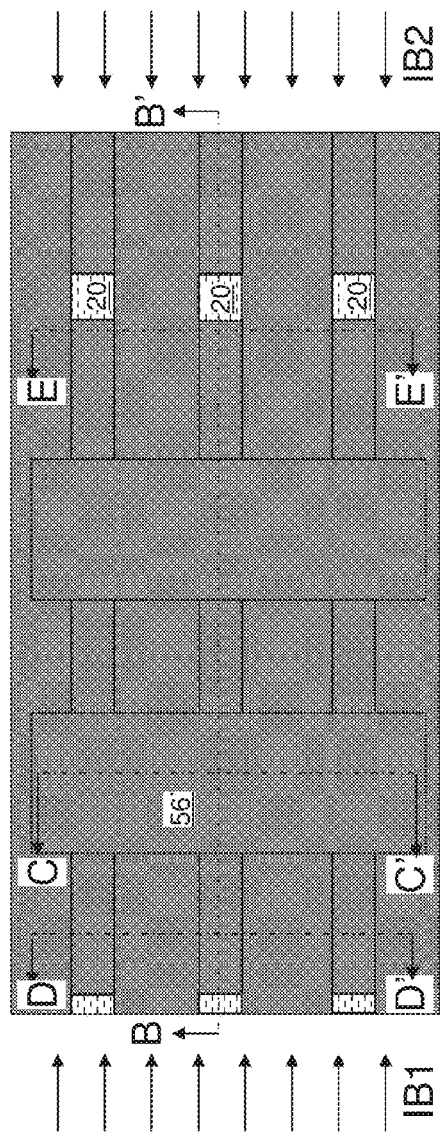
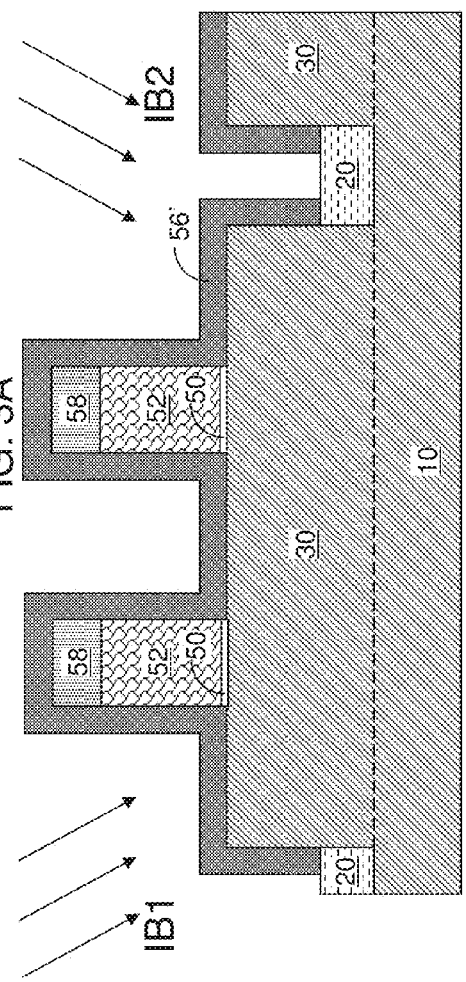
FIG. 3A
FIG. 3B

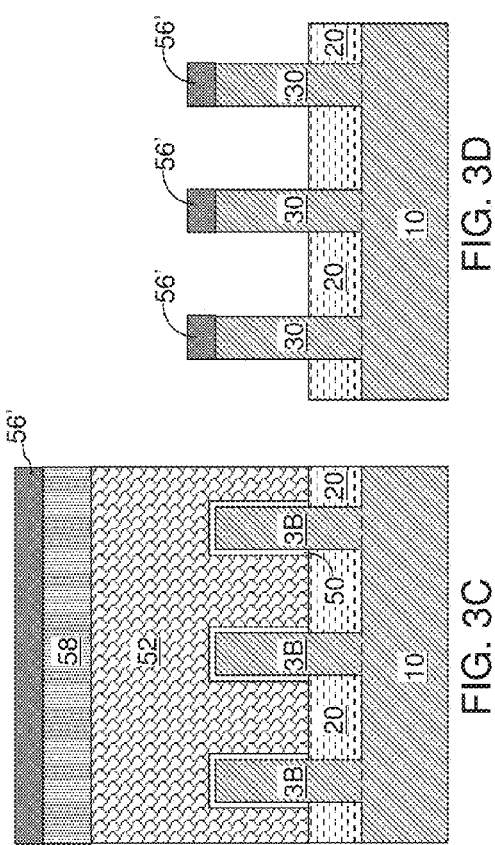
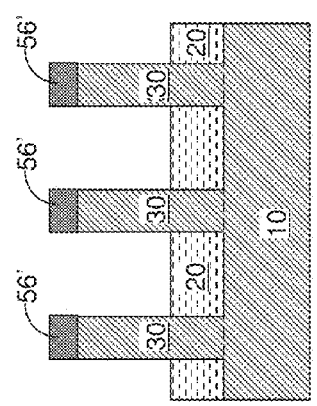
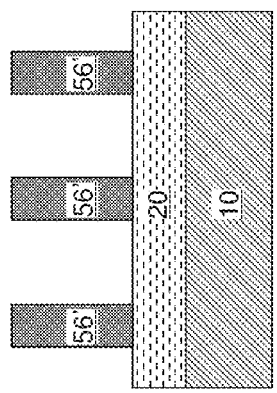
FIG. 3C
FIG. 3D
FIG. 3E

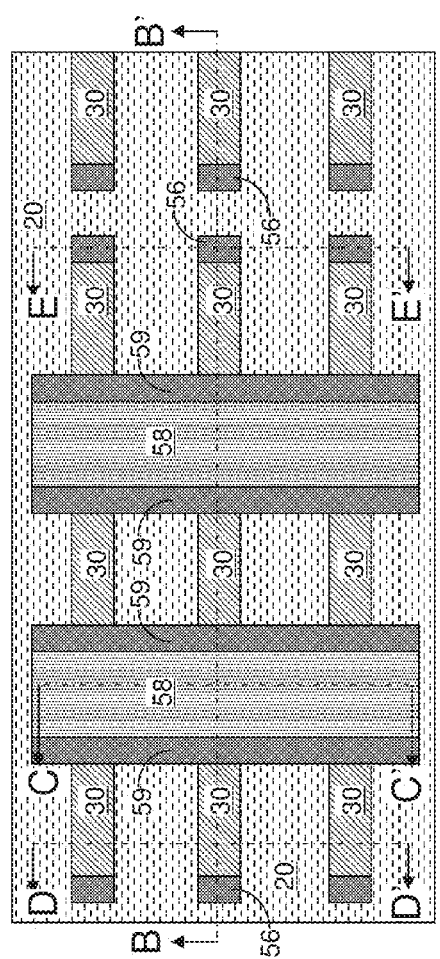
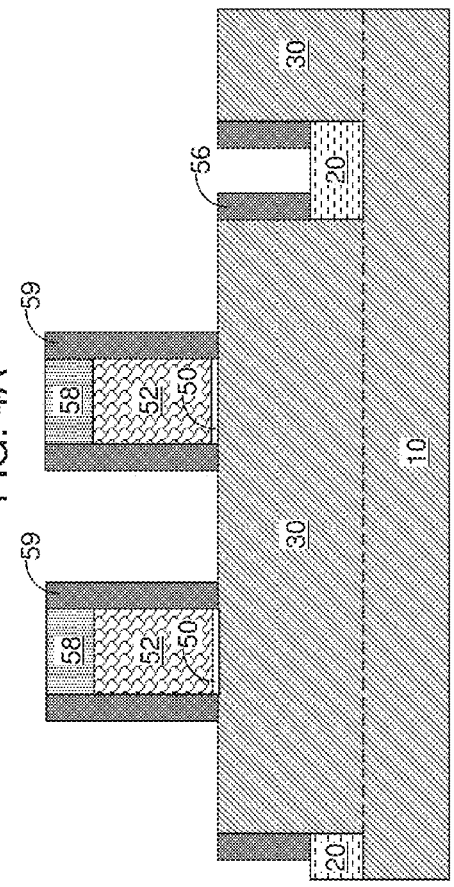
FIG. 4A
FIG. 4B

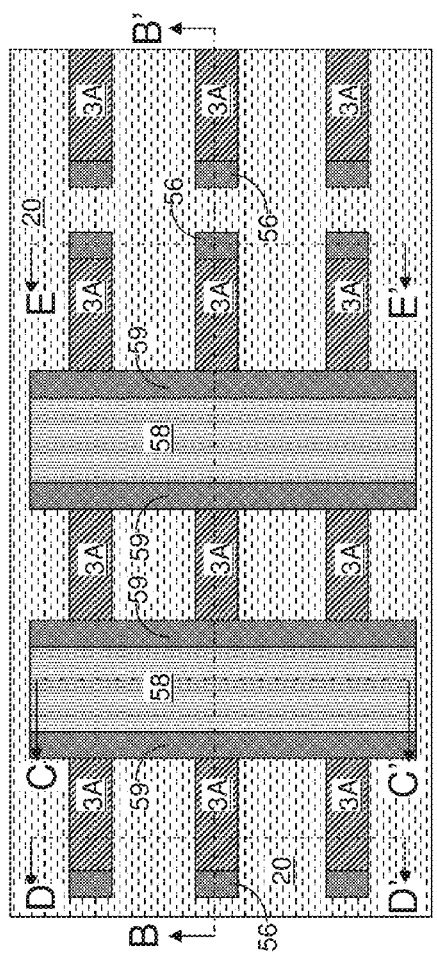
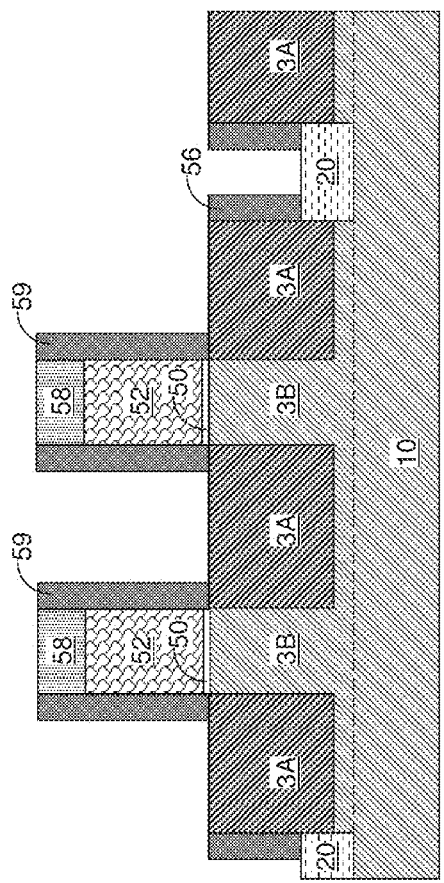
FIG. 5A
FIG. 5B

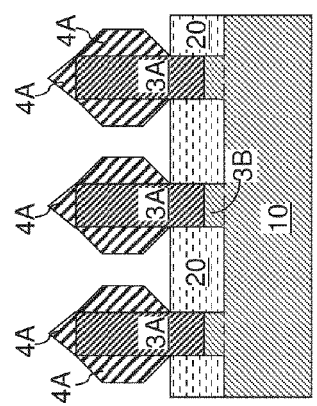
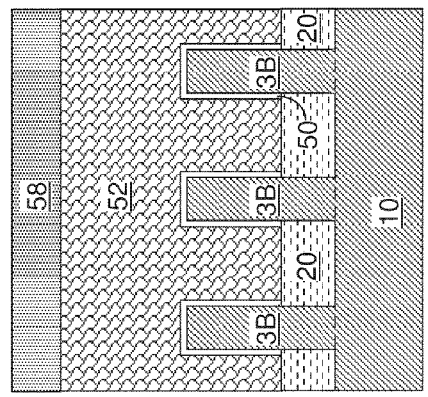
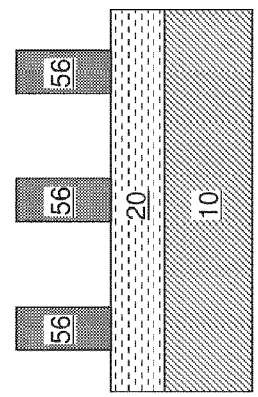

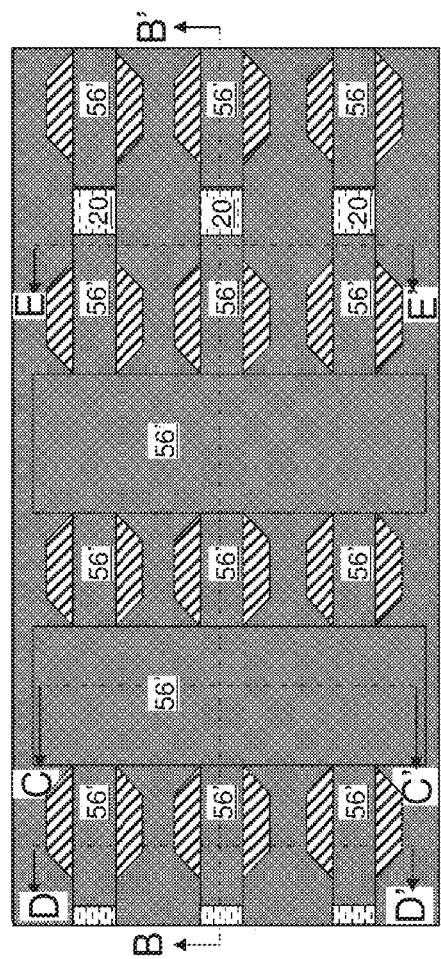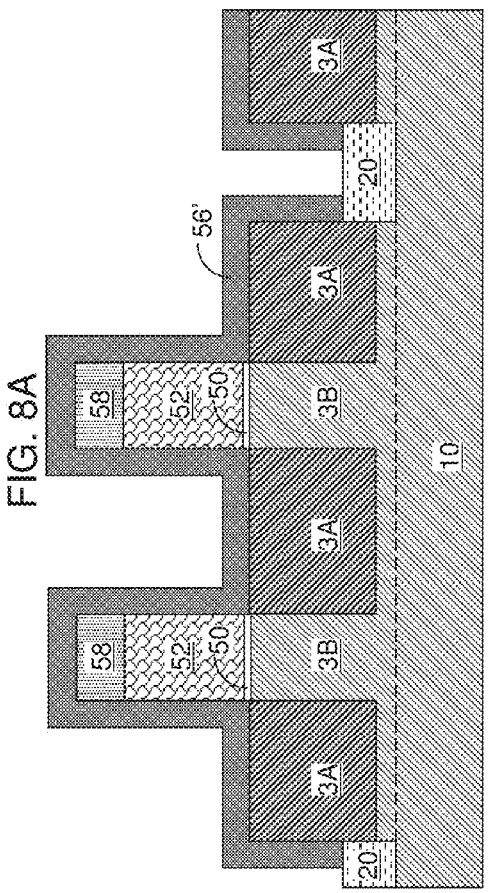
FIG. 8A
FIG. 8B

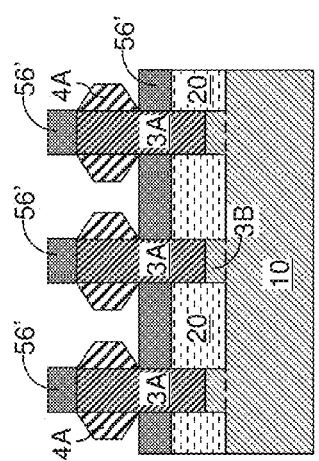
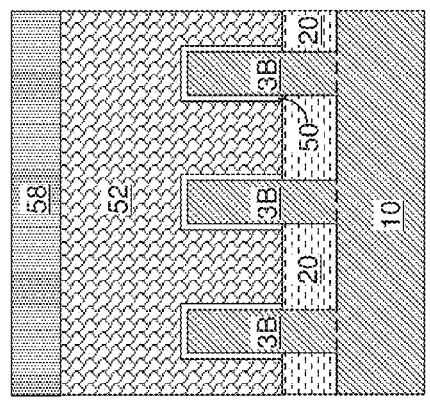
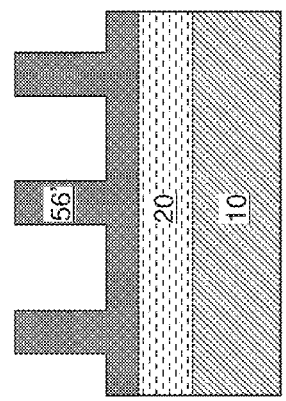

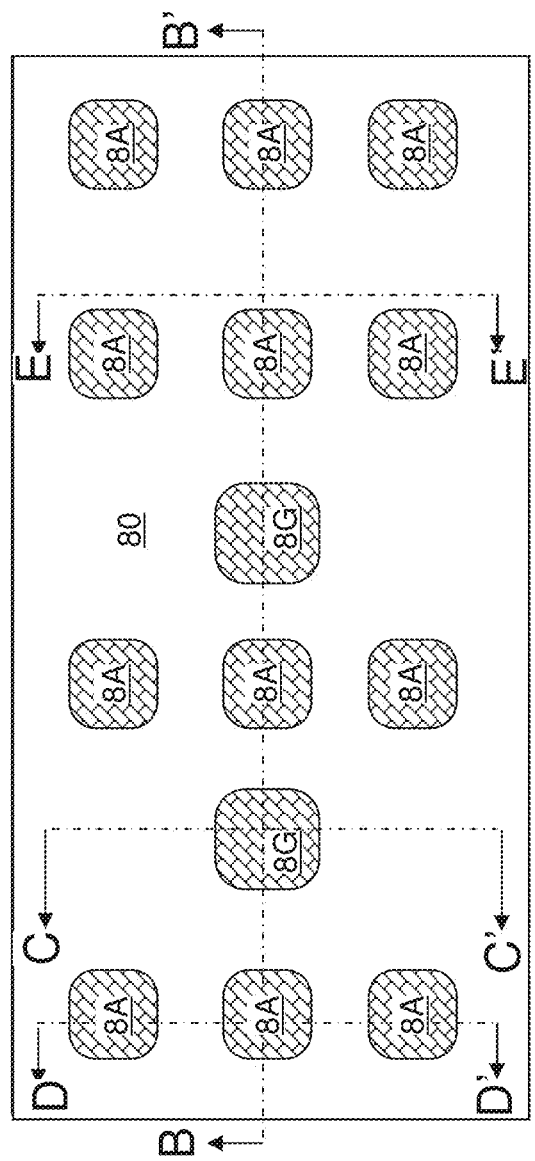

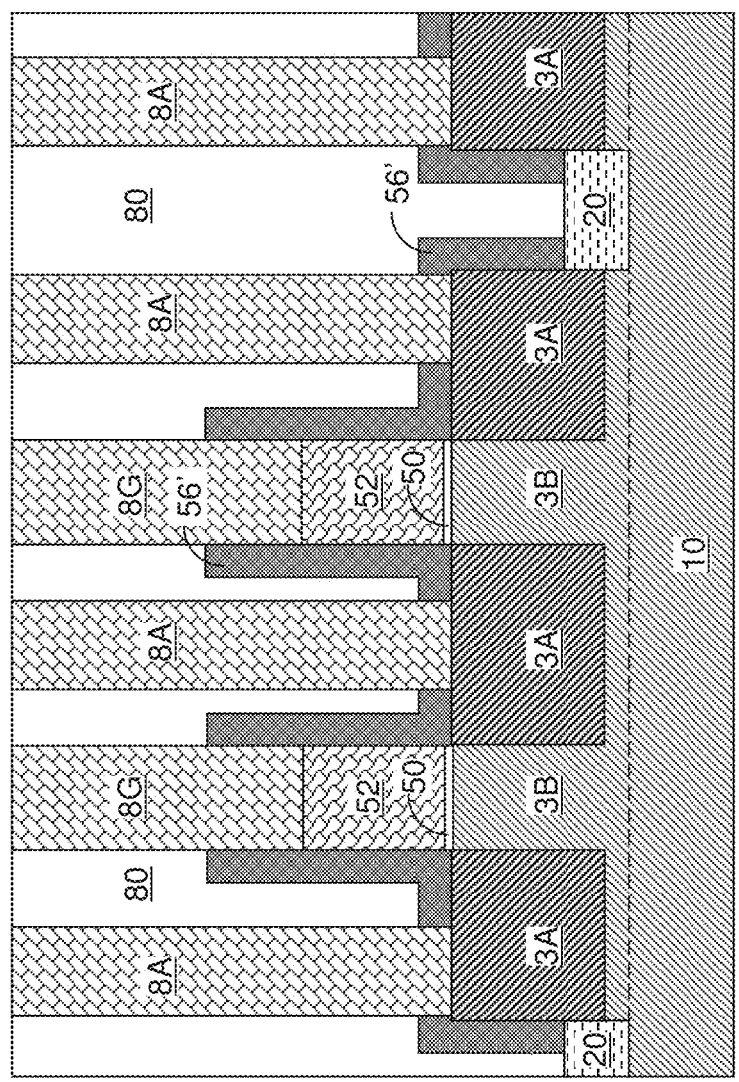

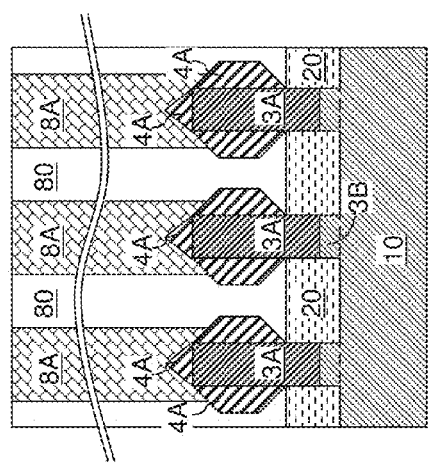
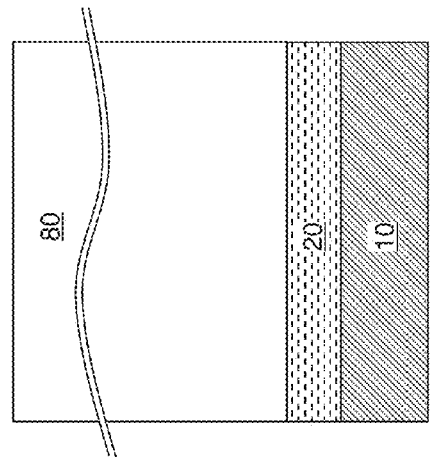
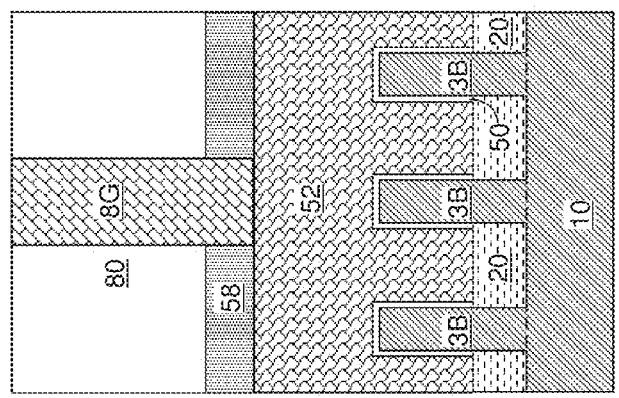

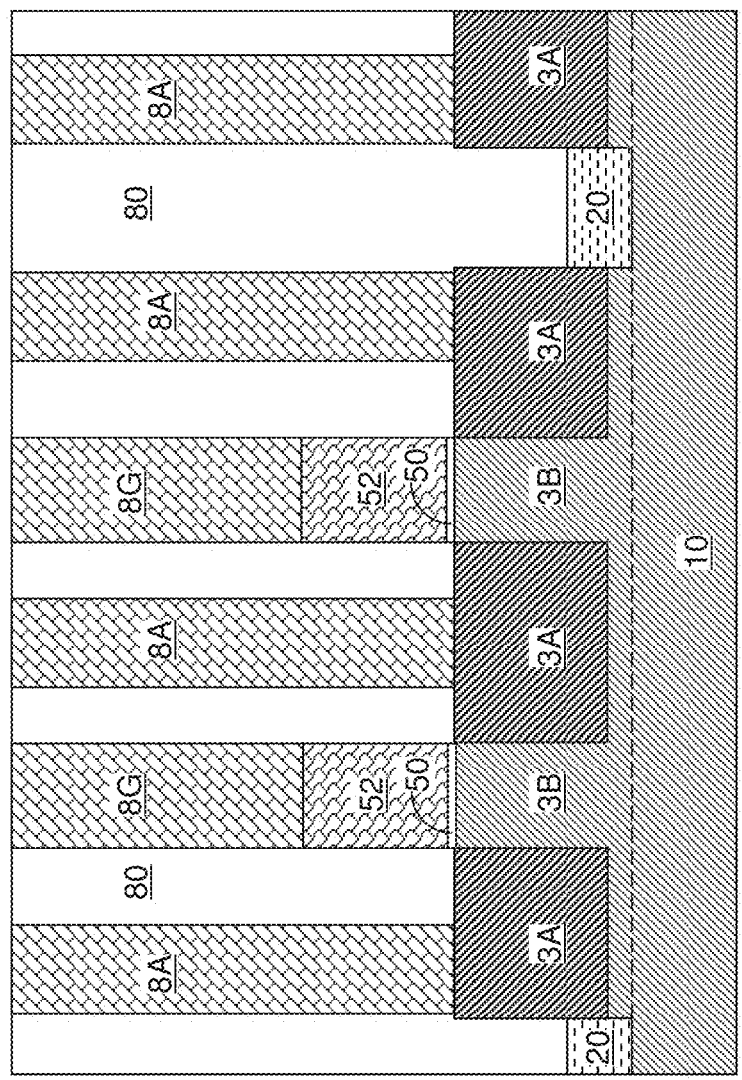

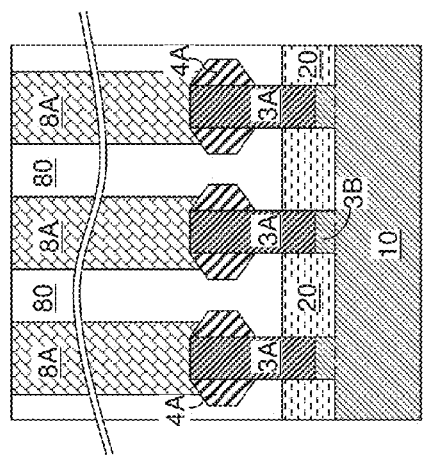
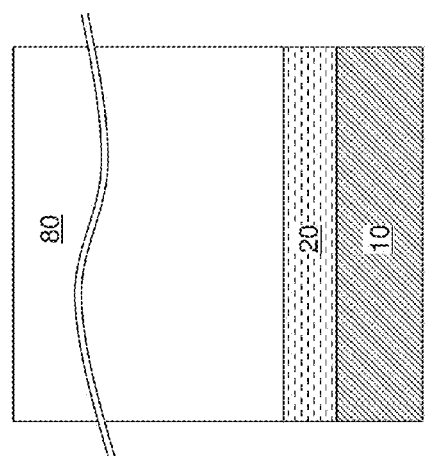
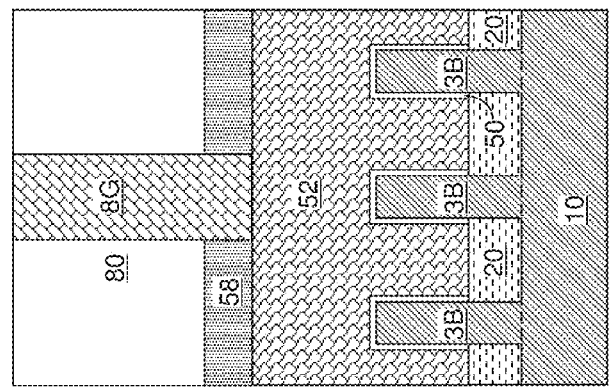

FIN END SPACER FOR PREVENTING MERGER OF RAISED ACTIVE REGIONS

BACKGROUND

The present disclosure relates to a semiconductor structure, and particularly to a method of preventing merger of raised active regions from adjacent semiconductor fins employing a fin end spacer, and structures formed by the same.

Fin field effect transistors are widely employed in advanced semiconductor circuits for their superior performance over planar field effect transistors. Fin field effect transistors provide a high on-current per area and full depletion of a channel during operation. One of the challenges for implementing fin field effect transistors is the tendency for raised active regions, which include raised source regions and raised drain regions, in adjacent semiconductor fins to be electrically shorted unless sufficient lateral distance is provided among the adjacent semiconductor fins. While an electrical short between two semiconductor fins may be avoided by increasing a lateral spacing between the two semiconductor fins, the increase in lateral spacing among semiconductor fins results in an overall decrease in the areal density of semiconductor devices. Thus, a method is desired for preventing electrical shorts among adjacent semiconductor fins without reduction in the areal density in the semiconductor devices.

SUMMARY

After formation of gate structures over semiconductor fins and prior to formation of raised active regions, a directional ion beam is employed to form a dielectric material portion on end walls of semiconductor fins that are perpendicular to the lengthwise direction of the semiconductor fins. The angle of the directional ion beam is selected to be with a vertical plane including the lengthwise direction of the semiconductor fins, thereby avoiding formation of the dielectric material portion on lengthwise sidewalls of the semiconductor fins. Selective epitaxy of semiconductor material is performed to grow raised active regions from sidewall surfaces of the semiconductor fins. Optionally, horizontal portions of the dielectric material portion may be removed prior to the selective epitaxy process. Further, the dielectric material portion may optionally be removed after the selective epitaxy process.

According to an aspect of the present disclosure, a semiconductor structure includes a fin active region located within a semiconductor fin that is located on a substrate. Surfaces of the fin active region include a widthwise sidewall of the semiconductor fin and portions of a pair of lengthwise sidewalls of the semiconductor fin. The semiconductor structure further includes a dielectric material portion contacting an entirety of the widthwise sidewall, a raised active region including a pair of doped semiconductor material portions located on the portions of the pair of lengthwise sidewalls, and a contact level dielectric layer in physical contact with the dielectric material portion and the raised active region.

According to another aspect of the present disclosure, a semiconductor structure includes a fin active region located within a semiconductor fin that is located on a substrate. Surfaces of the fin active region include a widthwise sidewall of the semiconductor fin and portions of a pair of lengthwise sidewalls of the semiconductor fin. The semiconductor structure further includes a gate structure straddling the semiconductor fin, a raised active region including a pair of doped semiconductor material portions located on the portions of the pair of lengthwise sidewalls and laterally spaced from the gate structure, and a contact level dielectric layer in physical contact with the widthwise sidewall and surfaces of the pair of lengthwise sidewalls of the semiconductor fin that are located between the gate structure and the raised active region.

According to yet another aspect of the present disclosure, a method of forming a semiconductor structure is provided. A semiconductor fin is formed on a substrate. The semiconductor fin includes a pair of lengthwise sidewalls and a widthwise sidewall. A dielectric material portion is formed employing a directional ion beam that impinges on the widthwise sidewall along a beam direction that is contained within a vertical plane parallel to the pair of lengthwise sidewalls. At least one raised active region is formed on physically exposed semiconductor surfaces of the semiconductor fin while the dielectric material portion is present on the widthwise sidewall.

BRIEF DESCRIPTION OF SEVERAL VIEWS OF THE DRAWINGS

FIG. 2A is a top-down view of a first exemplary semiconductor structure after formation of gate structures according to an embodiment of the present disclosure.

FIG. 2B is a vertical cross-sectional view of the first exemplary structure along the vertical plane B-B' in FIG. 2A.

FIG. 3A is a top-down view of a first exemplary semiconductor structure after formation of a dielectric material layer employing a directional ion beam according to an embodiment of the present disclosure.

FIG. 3B is a vertical cross-sectional view of the first exemplary structure along the vertical plane B-B' in FIG. 3A.

FIG. 3C is a vertical cross-sectional view of the first exemplary structure along the vertical plane C-C' in FIG. 3A.

FIG. 3D is a vertical cross-sectional view of the first exemplary structure along the vertical plane D-D' in FIG. 3A.

FIG. 3E is a vertical cross-sectional view of the first exemplary structure along the vertical plane E-E' in FIG. 3A.

FIG. 4A is a top-down view of a first exemplary semiconductor structure after an anisotropic etch that removes horizontal portions of the dielectric material layer according to an embodiment of the present disclosure.

FIG. 4B is a vertical cross-sectional view of the first exemplary structure along the vertical plane B-B' in FIG. 4A.

FIG. 5A is a top-down view of a first exemplary semiconductor structure after formation of fin active regions according to an embodiment of the present disclosure.

FIG. 5B is a vertical cross-sectional view of the first exemplary structure along the vertical plane B-B' in FIG. 5A.

FIG. 6C is a vertical cross-sectional view of the first exemplary structure along the vertical plane C-C' in FIG. 6A.

FIG. 6D is a vertical cross-sectional view of the first exemplary structure along the vertical plane D-D' in FIG. 6A.

FIG. 6E is a vertical cross-sectional view of the first exemplary structure along the vertical plane E-E' in FIG. 6A.

FIG. 8A is a top-down view of a second exemplary semiconductor structure after formation of raised active regions according to an embodiment of the present disclosure.

FIG. 8B is a vertical cross-sectional view of the first exemplary structure along the vertical plane B-B' in FIG. 8A.

FIG. 8C is a vertical cross-sectional view of the first exemplary structure along the vertical plane C-C' in FIG. 8A.

FIG. 8D is a vertical cross-sectional view of the first exemplary structure along the vertical plane D-D' in FIG. 8A.

FIG. 8E is a vertical cross-sectional view of the first exemplary structure along the vertical plane E-E' in FIG. 8A.

FIG. 9A is a top-down view of the second exemplary semiconductor structure after formation of a contact level dielectric layer and various contact via structures according to an embodiment of the present disclosure.

FIG. 9B is a vertical cross-sectional view of the first exemplary structure along the vertical plane B-B' in FIG. 9A.

FIG. 11C is a vertical cross-sectional view of the first exemplary structure along the vertical plane C-C' in FIG. 11A.

FIG. 11D is a vertical cross-sectional view of the first exemplary structure along the vertical plane D-D' in FIG. 11A.

FIG. 11E is a vertical cross-sectional view of the first exemplary structure along the vertical plane E-E' in FIG. 11A.

FIG. 12B is a vertical cross-sectional view of the first exemplary structure along the vertical plane B-B' in FIG. 12A.

FIG. 12C is a vertical cross-sectional view of the first exemplary structure along the vertical plane C-C' in FIG. 12A.

FIG. 12D is a vertical cross-sectional view of the first exemplary structure along the vertical plane D-D' in FIG. 12A.

FIG. 12E is a vertical cross-sectional view of the first exemplary structure along the vertical plane E-E' in FIG. 12A.

DETAILED DESCRIPTION

Figure 1A:
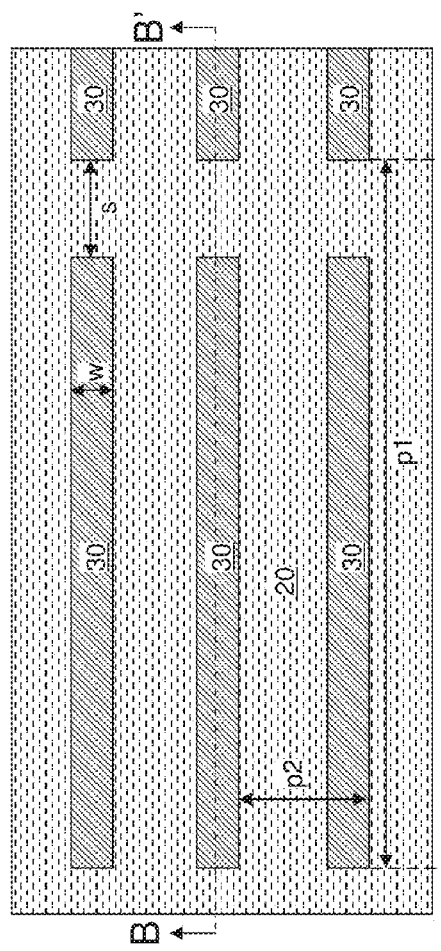
FIG. 1A is a top-down view of a first exemplary semiconductor structure after formation of semiconductor fins and a shallow trench isolation layer according to an embodiment of the present disclosure.

As stated above, the present disclosure relates to a method of preventing merger of raised active regions from adjacent semiconductor fins employing a fin end spacer, and structures formed by the same. These aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Figure 1B:
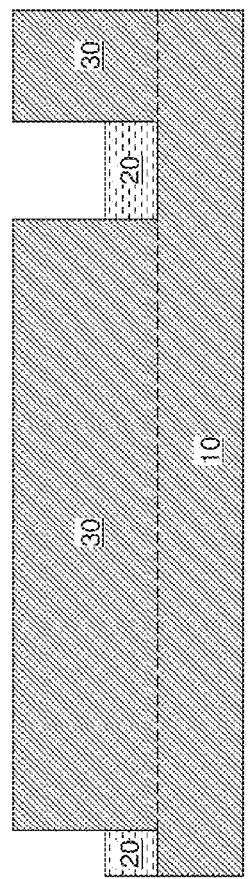
FIG. 1B is a vertical cross-sectional view of the first exemplary structure along the vertical plane B-B' in FIG. 1A.
Figure 2C:
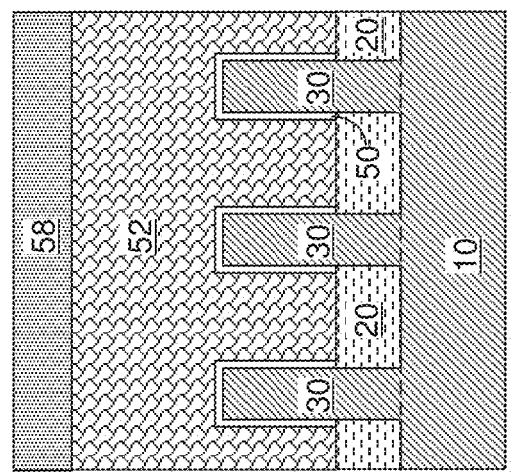
FIG. 2C is a vertical cross-sectional view of the first exemplary structure along the vertical plane C-C' in FIG. 2A.
Figure 2D:
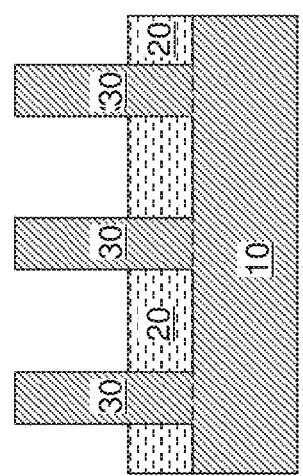
FIG. 2D is a vertical cross-sectional view of the first exemplary structure along the vertical plane D-D' in FIG. 2A.
Figure 4D:
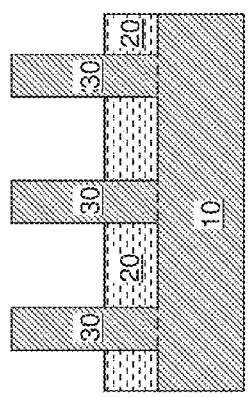
FIG. 4D is a vertical cross-sectional view of the first exemplary structure along the vertical plane D-D' in FIG. 4A.
Figure 4C:
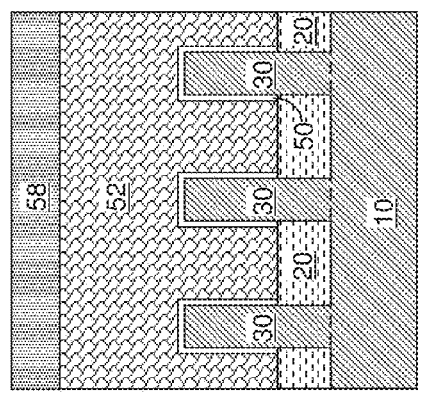
FIG. 4C is a vertical cross-sectional view of the first exemplary structure along the vertical plane C-C' in FIG. 4A.
Figure 4E:
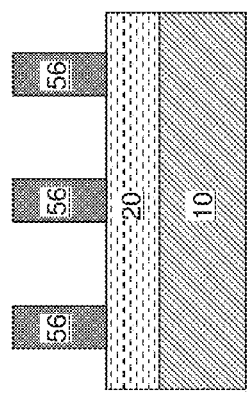
FIG. 4E is a vertical cross-sectional view of the first exemplary structure along the vertical plane E-E' in FIG. 4A.
Figure 5C:
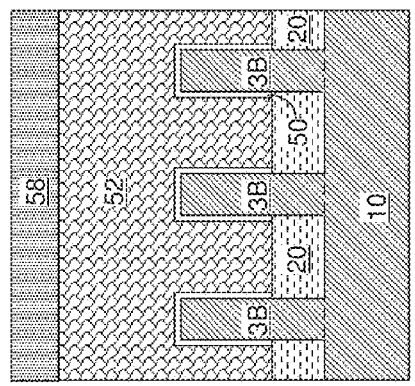
FIG. 5C is a vertical cross-sectional view of the first exemplary structure along the vertical plane C-C' in FIG. 5A.
Figure 5D:
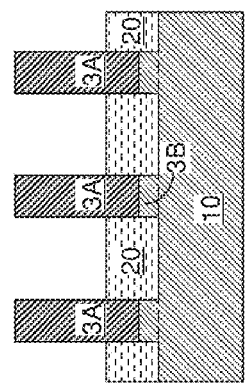
FIG. 5D is a vertical cross-sectional view of the first exemplary structure along the vertical plane D-D' in FIG. 5A.
Figure 5E:
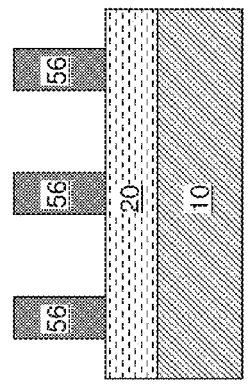
FIG. 5E is a vertical cross-sectional view of the first exemplary structure along the vertical plane E-E' in FIG. 5A.
Figure 6A:
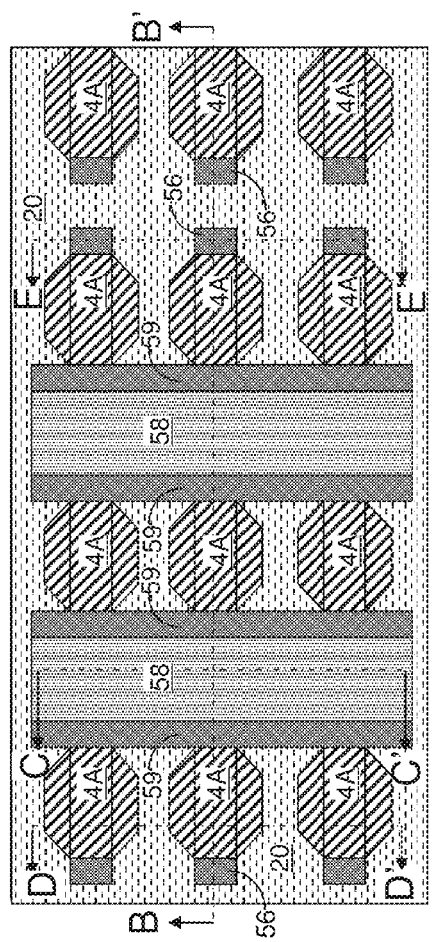
FIG. 6A is a top-down view of a first exemplary semiconductor structure after formation of raised active regions according to an embodiment of the present disclosure.
Figure 6B:
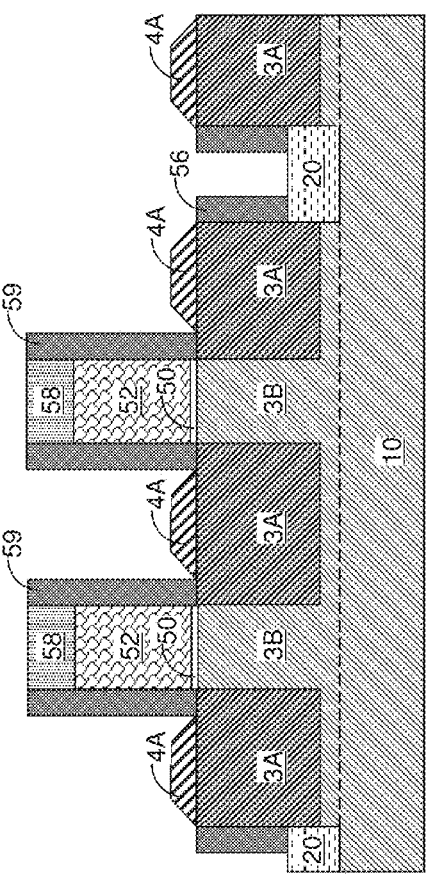
FIG. 6B is a vertical cross-sectional view of the first exemplary structure along the vertical plane B-B' in FIG. 6A.
Figure 7A:
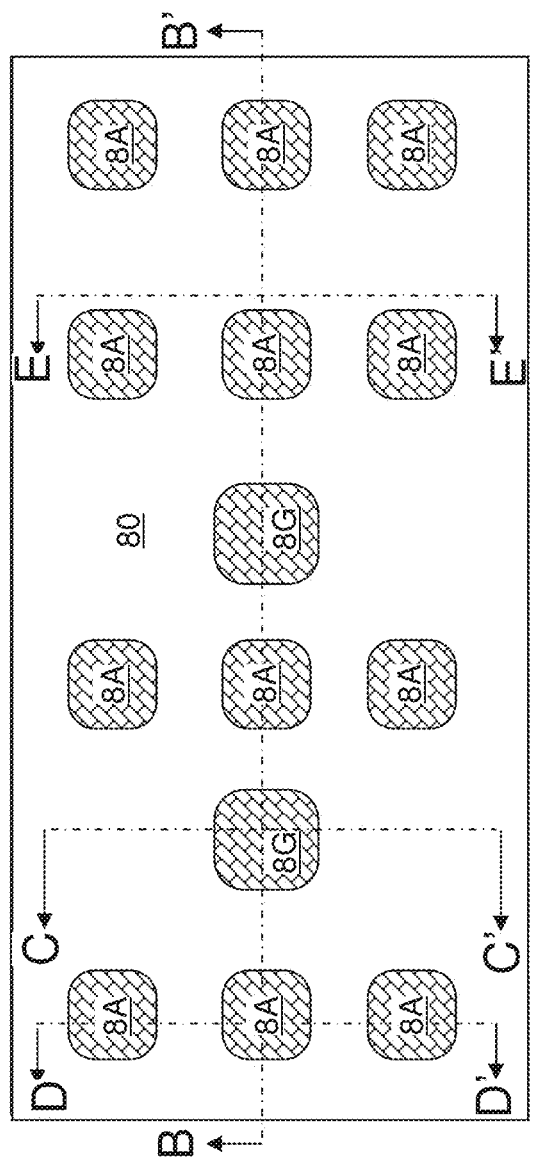
FIG. 7A is a top-down view of a first exemplary semiconductor structure after formation of a contact level dielectric layer and various contact via structures according to an embodiment of the present disclosure.
Figure 7B:
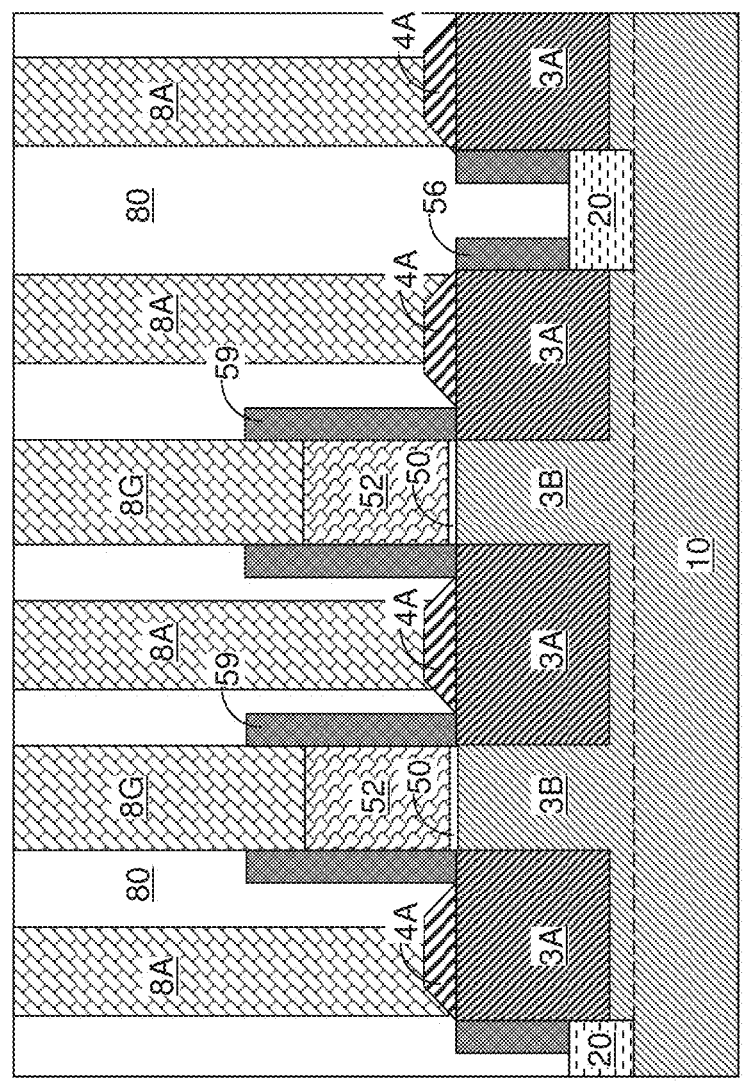
FIG. 7B is a vertical cross-sectional view of the first exemplary structure along the vertical plane B-B' in FIG. 7A.
Figure 7D:
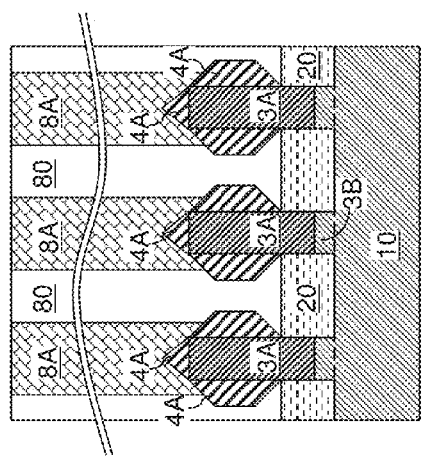
FIG. 7D is a vertical cross-sectional view of the first exemplary structure along the vertical plane D-D' in FIG. 7A.
Figure 7E:
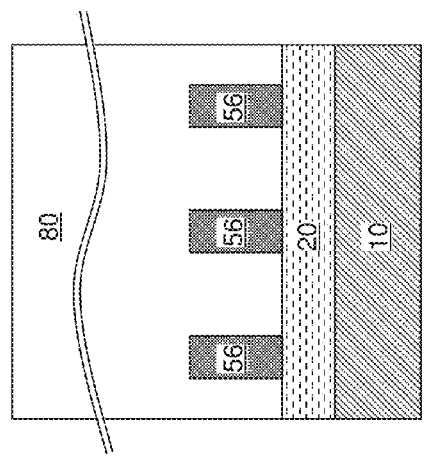
FIG. 7E is a vertical cross-sectional view of the first exemplary structure along the vertical plane E-E' in FIG. 7A.
Figure 7C:
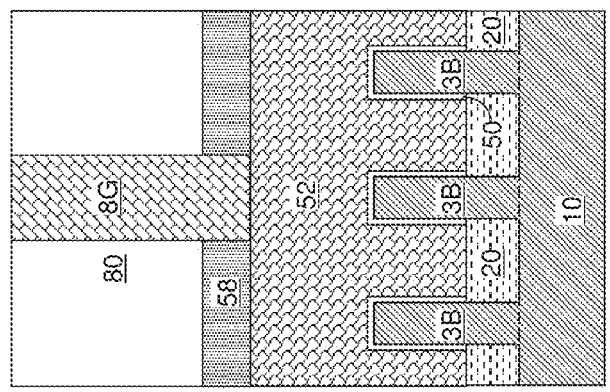
FIG. 7C is a vertical cross-sectional view of the first exemplary structure along the vertical plane C-C' in FIG. 7A.
Figure 9D:
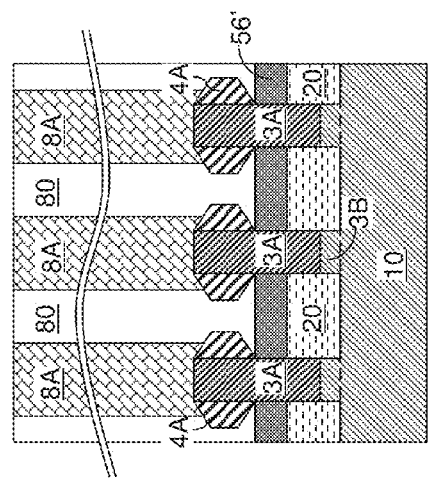
FIG. 9D is a vertical cross-sectional view of the first exemplary structure along the vertical plane D-D' in FIG. 9A.
Figure 9E:
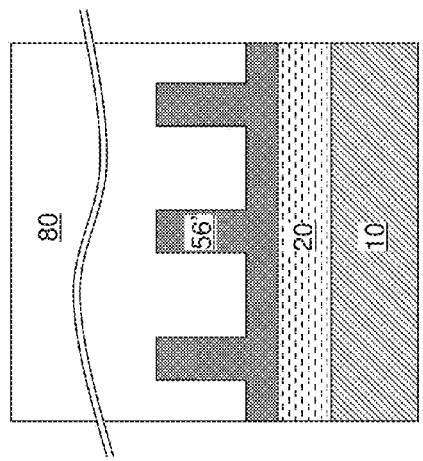
FIG. 9E is a vertical cross-sectional view of the first exemplary structure along the vertical plane E-E' in FIG. 9A.
Figure 9C:
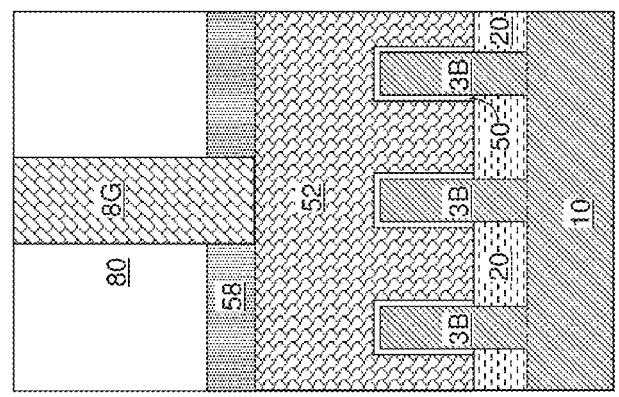
FIG. 9C is a vertical cross-sectional view of the first exemplary structure along the vertical plane C-C' in FIG. 9A.
Figure 10A:
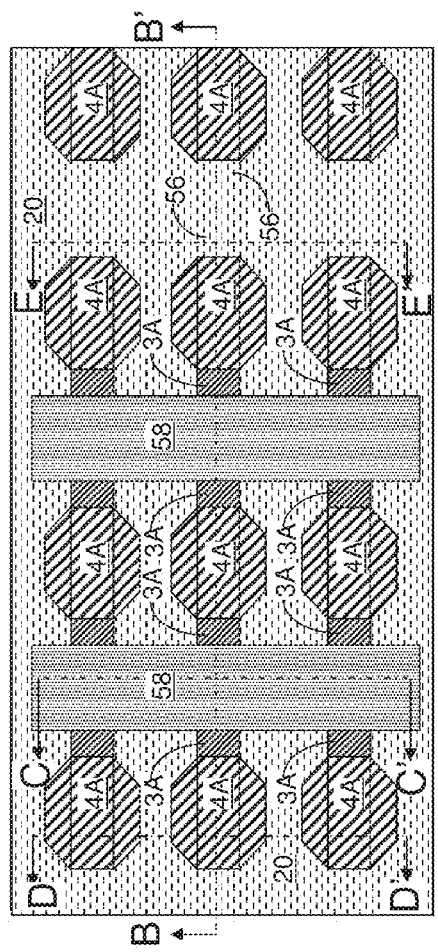
FIG. 10A is a top-down view of a third exemplary semiconductor structure after removal of dielectric spacers according to an embodiment of the present disclosure.
Figure 10B:
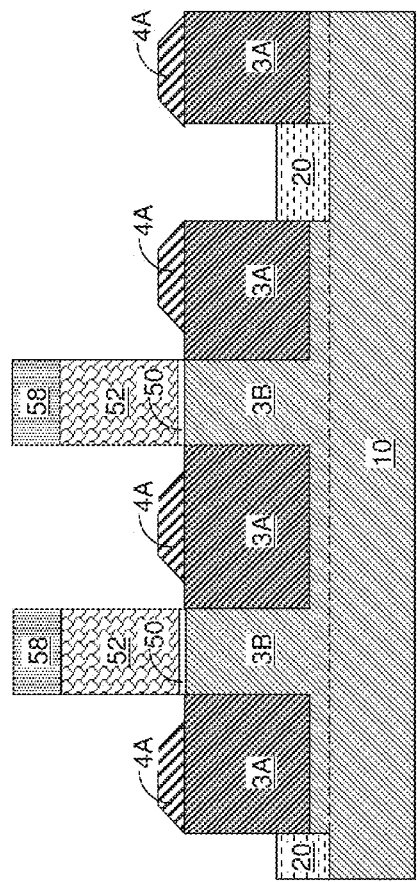
FIG. 10B is a vertical cross-sectional view of the first exemplary structure along the vertical plane B-B' in FIG. 10A.
Figure 10D:
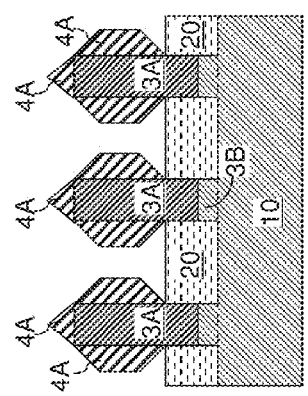
FIG. 10D is a vertical cross-sectional view of the first exemplary structure along the vertical plane D-D' in FIG. 10A.
Figure 10C:
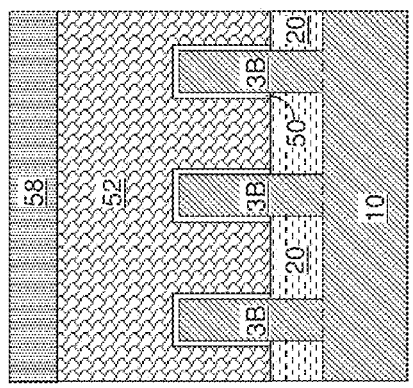
FIG. 10C is a vertical cross-sectional view of the first exemplary structure along the vertical plane C-C' in FIG. 10A.
Figure 10E:
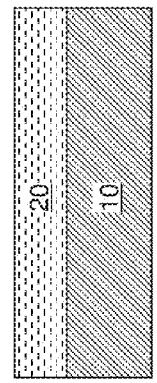
FIG. 10E is a vertical cross-sectional view of the first exemplary structure along the vertical plane E-E' in FIG. 10A.
Figure 11A:
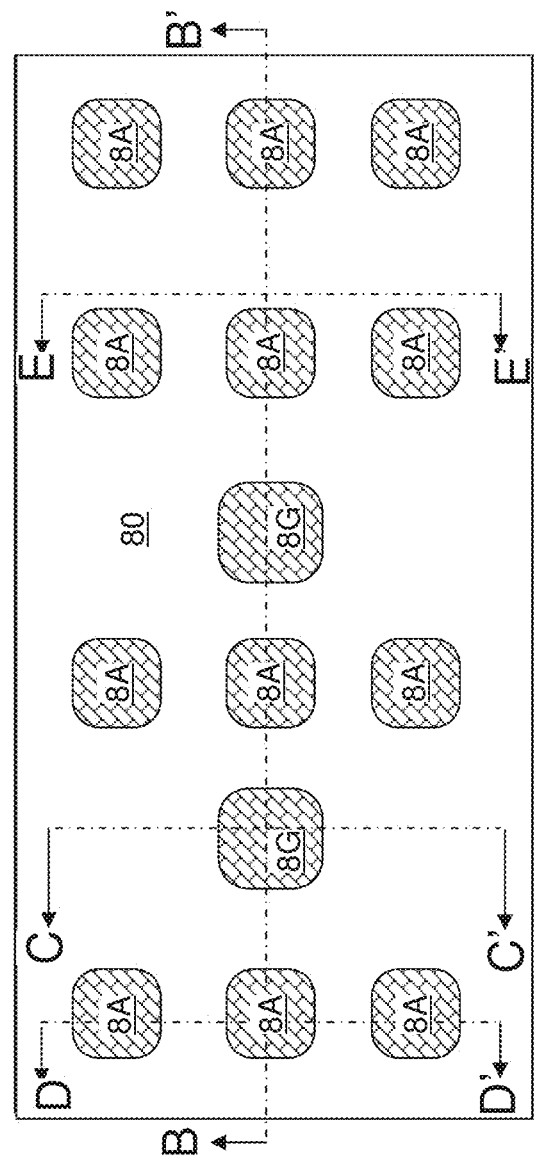
FIG. 11A is a top-down view of the third exemplary semiconductor structure after formation of a contact level dielectric layer and various contact via structures according to an embodiment of the present disclosure.
Figure 11B:
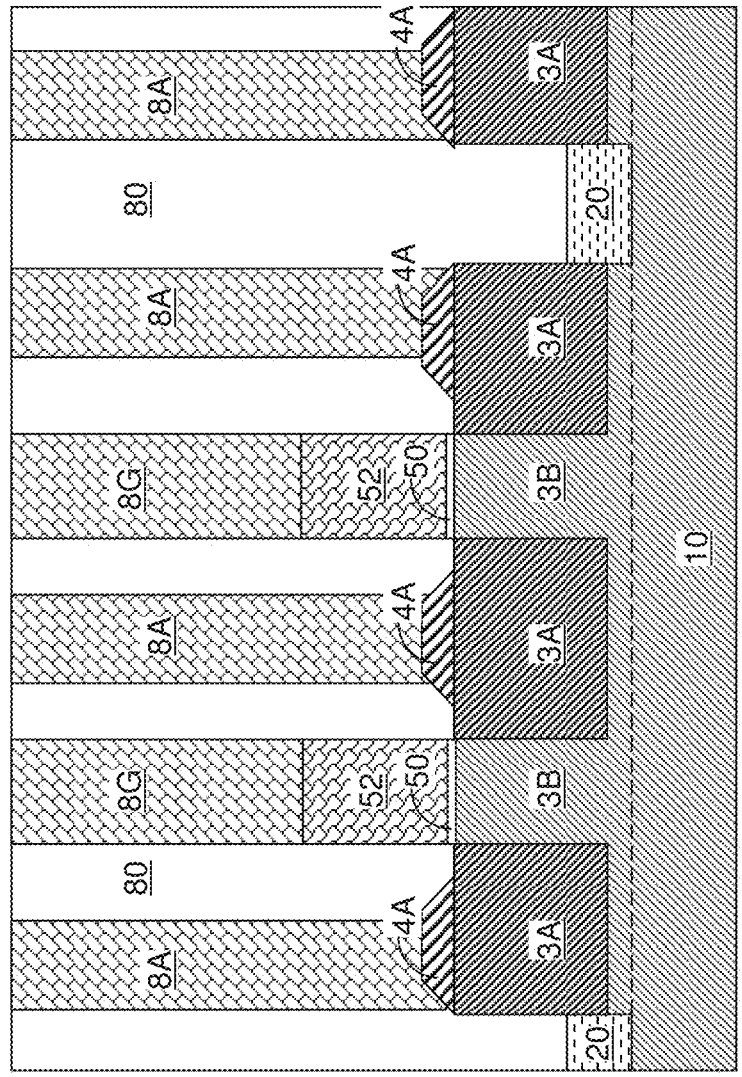
FIG. 11B is a vertical cross-sectional view of the first exemplary structure along the vertical plane B-B' in FIG. 11A.
Figure 12A:
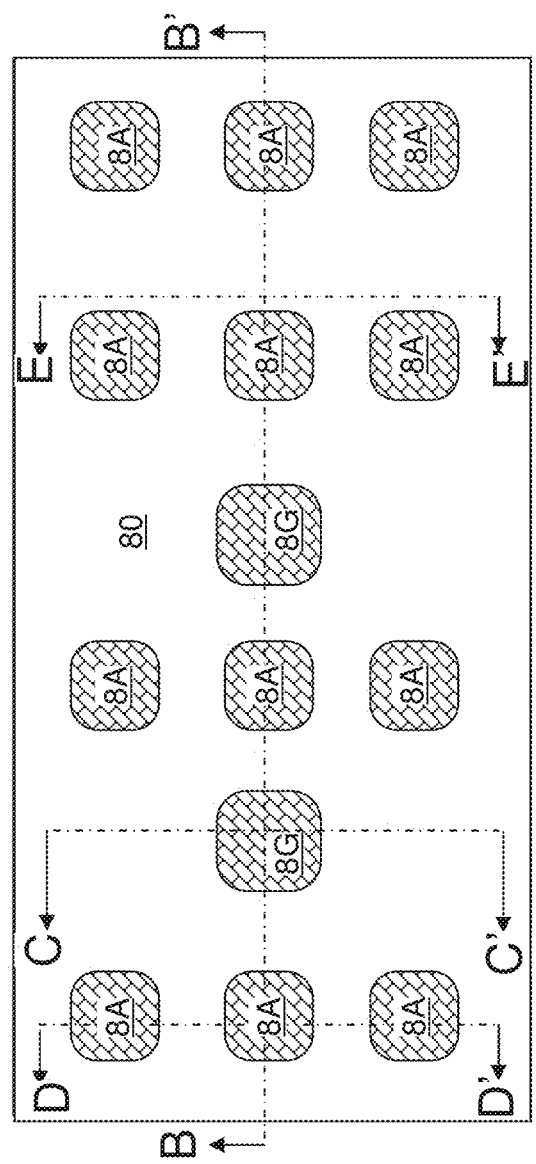
FIG. 12A is a top-down view of a fourth exemplary semiconductor structure after formation of a contact level dielectric layer and various contact via structures according to an embodiment of the present disclosure.
Figure 13A:
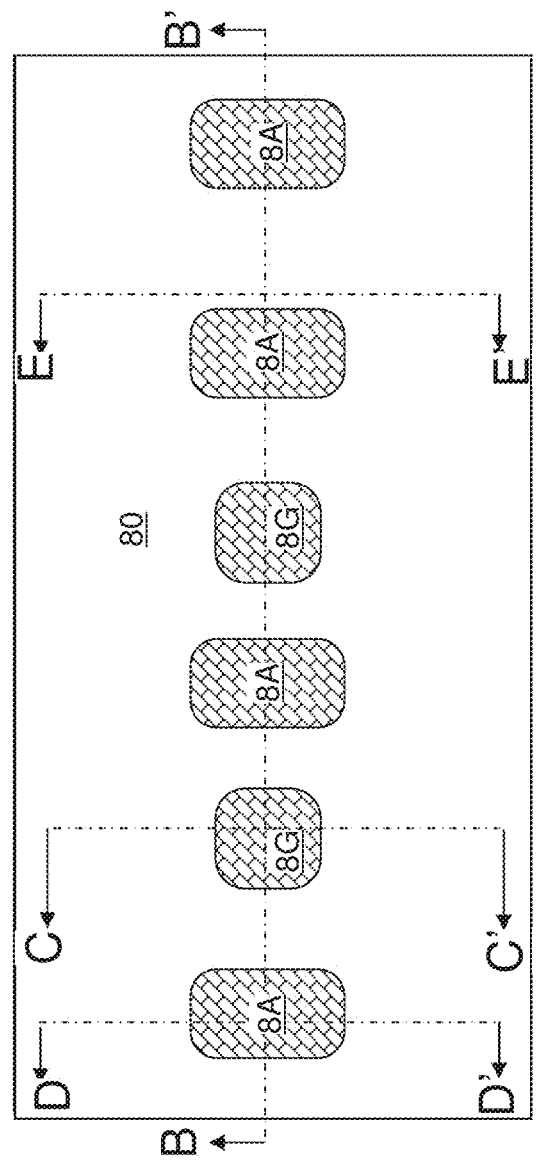
FIG. 13A is a top-down view of a fifth exemplary semiconductor structure after formation of a contact level dielectric layer and various contact via structures according to an embodiment of the present disclosure.
Figure 13B:
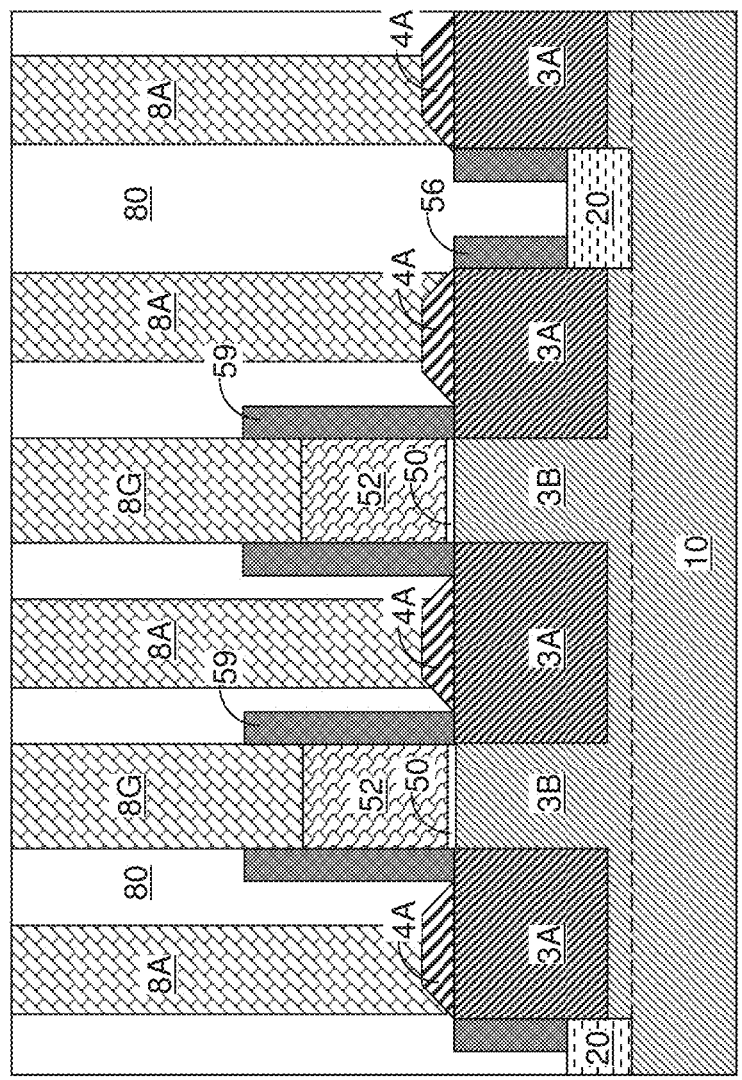
FIG. 13B is a vertical cross-sectional view of the first exemplary structure along the vertical plane B-B' in FIG. 13A.
Figure 13D:
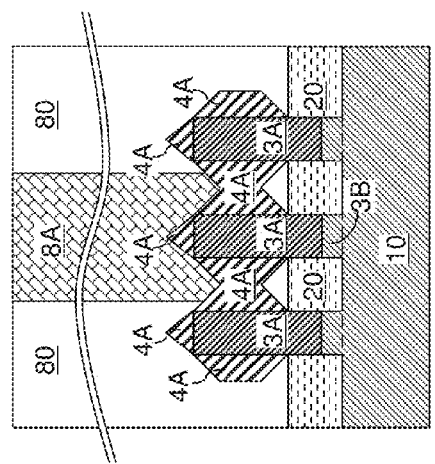
FIG. 13D is a vertical cross-sectional view of the first exemplary structure along the vertical plane D-D' in FIG. 13A.
Figure 13E:
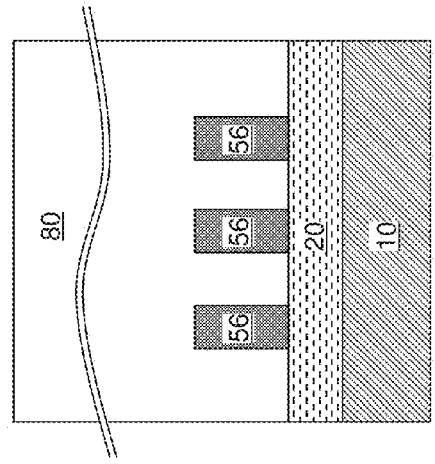
FIG. 13E is a vertical cross-sectional view of the first exemplary structure along the vertical plane E-E' in FIG. 13A.
Figure 13C:
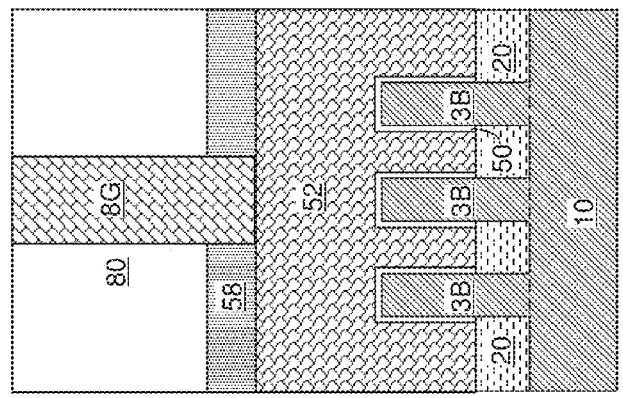
FIG. 13C is a vertical cross-sectional view of the first exemplary structure along the vertical plane C-C' in FIG. 13A.

Referring to FIGS. 1A and 1B, a first exemplary semiconductor structure according to an embodiment of the present disclosure can be formed by providing a semiconductor substrate, which can be a bulk semiconductor substrate or a semiconductor-on-insulator (SOI) substrate. At least an upper portion of the semiconductor substrate includes a semiconductor material, which can be selected from elemental semiconductor materials (e.g., silicon, germanium, carbon, or alloys thereof), III-V semiconductor materials, or II-VI semiconductor materials. In one embodiment, the semiconductor substrate can include a single crystalline semiconductor material.

The upper portion of the semiconductor substrate can be patterned, by a combination of lithographic methods and an anisotropic etch, to form a plurality of semiconductor fins 30. For example, a photoresist layer (not shown) can be applied over the top surface of the semiconductor substrate and lithographically patterned to mask portions of the semiconductor substrate in which the plurality of semiconductor fins 30 is subsequently formed. The pattern in the photoresist layer can be transferred into the upper portion of the semiconductor substrate to form the plurality of semiconductor fins 30. If the semiconductor substrate is a bulk substrate, the remaining portion of the semiconductor substrate underlying the plurality of semiconductor fins 30 is herein referred to as a semiconductor material layer 10. In this case, the semiconductor material layer 10 is a substrate on which the semiconductor fins 30 are formed. The semiconductor material layer 10 functions as a substrate mechanically supporting the plurality of semiconductor fins 30. The plurality of semiconductor fins 30 and the semiconductor material layer 10 collectively constitute a contiguous semiconductor material portion. In one embodiment, the entirety of the contiguous semiconductor material portion can be single crystalline. Alternatively, if the semiconductor substrate is a semiconductor-on-insulator substrate, a vertical stack of a buried insulator layer and a handle substrate layer can be present underneath the plurality of semiconductor fins 30 in lieu of the semiconductor material layer 10. In this case, the vertical stack of the buried insulator layer and the handle substrate layer is a substrate on which the semiconductor fins 30 are formed.

The height of the semiconductor fins 30 can be from 5 nm to 1,000 nm, although lesser and greater heights can also be employed. The plurality of semiconductor fins 30 and the semiconductor material layer 10 can be doped with electrical dopants, i.e., p-type dopants or n-type dopants, or can be intrinsic. In one embodiment, the entirety of the plurality of semiconductor fins 30 and the semiconductor material layer 10 can have a same type of doping, which is herein referred to as a first conductivity type. Optionally, a doped well (not shown) can be present in an upper portion of the semiconductor material layer 10 and underneath at least one semiconductor fin 30. Optionally, a channel stop layer having a doping of the opposite conductivity type as an upper portion of at least one semiconductor fin 30 may be provided at a bottom of the at least one semiconductor fin 30 or a portion of the semiconductor material layer 10 that underlies the at least one semiconductor fin 30. In general, various portions of the semiconductor material layer 10 and the semiconductor fins 30 can be doped to provide suitable electrical isolation among the plurality of semiconductor fins 30.

As used herein, a "semiconductor fin" refers to a semiconductor material portion having a pair of parallel vertical sidewalls that are laterally spaced by a uniform dimension. In one embodiment, each semiconductor fin can have a rectangular horizontal cross-sectional area such that the spacing between the pair of parallel vertical sidewalls is the same as the length of shorter sides of the shape of the rectangular horizontal cross-sectional area. As used herein, a "fin field effect transistor" refers to a field effect transistor in which at least a channel region is located within a semiconductor fin.

Each semiconductor fin 30 is laterally bound by a pair of lengthwise sidewalls and a pair of widthwise sidewalls. As used herein, a "lengthwise direction" of an element refers to a direction that is parallel to the axis which passes through the center of mass of the element and about which the moment of inertia of the element becomes a minimum. As used herein, a "lengthwise sidewall" of an element refers to a sidewall of an element that extends along the lengthwise direction of the element. As used herein, a "widthwise sidewall" of an element refers to a sidewall of the element that extends along a horizontal direction that is perpendicular to the lengthwise direction of the element. In one embodiment, each of the plurality of semiconductor fins 30 can have a rectangular horizontal cross-sectional shape.

In one embodiment, lengthwise sidewalls of a semiconductor fin 30 can be within a pair of vertical planes laterally spaced from each other by the width w of the semiconductor fin 30. In one embodiment, the plurality of semiconductor fins 30 can be within a two-dimensional array having a first pitch p1 along the lengthwise direction of the semiconductor fins 30 and a second pitch p2 along the lengthwise direction of the semiconductor fins 30. In one embodiment, widthwise sidewalls of a pair of semiconductor fins 30 laterally spaced along the lengthwise direction can be laterally spaced from each other by a spacing s.

A shallow trench isolation layer 20 can be formed among the plurality of semiconductor fins 30. The shallow trench isolation layer 20 includes a dielectric material such as silicon oxide. The shallow trench isolation layer 20 can be formed by depositing a dielectric material over the semiconductor fins 30 and the semiconductor material layer 10. The deposition of the dielectric material can be performed, for example, by chemical vapor deposition or spin coating. Excess portions of the deposited dielectric material can be removed from above the top surfaces of the semiconductor fins 30, for example, by planarization (such as chemical mechanical planarization (CMP)). The shallow trench isolation layer 30 laterally surrounds the plurality of semiconductor fins 30. The top surface of the shallow trench isolation layer 30 can be coplanar with the top surfaces of the plurality of semiconductor fins 30.

Referring to FIGS. 2A-2D, a stack of gate level layers can be deposited and lithographically patterned to form gate structures (50, 52, 58). The gate level layers can include, for example, a gate dielectric layer, a conductive material layer, and optionally, a gate cap layer.

The gate dielectric layer can be formed by conversion of surface portions of the semiconductor material of the semiconductor fins 30, deposition of a dielectric material, or a combination thereof. The gate dielectric layer can include a dielectric semiconductor-containing compound (e.g., silicon oxide, silicon nitride, and/or silicon oxynitride) and/or a dielectric metal compound (e.g., dielectric metal oxide, dielectric metal nitride, and/or dielectric metal oxynitride).

The conductive material layer can include at least one conductive material such as a metallic material, a doped semiconductor material, or a combination thereof. The conductive material layer can optionally include a work function metal layer that tunes the threshold voltage of the access transistor to be formed. The gate cap layer includes a dielectric material such as silicon nitride or a dielectric nitride.

The gate level layers can be patterned by a combination of lithography and etch to form the gate structures (50, 52, 58). The gate structures (50, 52, 58) straddle the portions of the semiconductor fins 30 that become body regions of field effect transistors. Each remaining portion of the gate dielectric layer within a gate structure (50, 52, 58) constitutes a gate dielectric 50. Each remaining portion of the conductive material layer within a gate structure (50, 52, 58) constitutes a gate electrode 52. Each remaining portion of the gate cap layer within a gate structure (50, 52, 58) constitutes a gate cap dielectric 58.

Portions of the semiconductor fins 30 that underlie the gate structures (50, 52, 58) correspond to the body regions of field effect transistors to be subsequently formed for the trench capacitors (12, 42, 44). The gate structures (50, 52, 58) can extend along the general direction of the widthwise direction of the plurality of semiconductor fins 30.

In one embodiment, the gate structures (50, 52, 58) are permanent gate structures that are present in field effect transistors and function as a combination of a gate dielectric and a gate electrode. In one embodiment, the gate structures (50, 52, 58) can be disposable gate structures that are subsequently replaced with replacement gate structures as known in the art.

Optionally, each gate structures (50, 52, 58) can further include a dielectric gate spacer (not shown). The dielectric gate spacers can be formed by depositing a conformal dielectric layer and anisotropically etching the conformal dielectric layer. The conformal dielectric layer can include, for example, silicon nitride, silicon oxide, or silicon oxynitride. The etch process that removes horizontal portions of the conformal dielectric layer can be prolonged after horizontal portions of the conformal dielectric layer are removed so that vertical portions of the conformal dielectric layer on sidewalls of the semiconductor fins 30 are removed, while the dielectric gate spacers remain on sidewalls of the gate electrodes 52. Each dielectric gate spacer, if present, laterally surrounds a gate electrode 52.

Referring to FIGS. 3A-3E, a dielectric material layer 56' is formed employing a directional ion beam. The directional ion beam can be generated by a gas cluster ion beam implantation tool known in the art. The process of depositing or implanting a material employing the directional ion beam is herein referred to as a directional ion beam deposition process. In one embodiment, the directional ion beam deposition process can employ a gas cluster ion beam as known in the art. A gas cluster ion beam includes typically thousands of weakly bound atoms or molecules, which become ionized with a small amount of electrical charge that typically corresponds to the electrical charge of a single electron or several electrons.

Angled gas cluster ion beam can be employed, which includes a dielectric material or a cluster of a gas such as oxygen or nitrogen. In gas cluster ion beam deposition, a cluster of ions having a molecular weight in a range from 100 to 100,000 can be singly ionized, or ionized with a number of electrons that does not typically exceed 10. Such clusters of ions can travel at a low enough speed to be deposited on a surface of the target of the gas cluster ion beam, or to be implanted immediately beneath a surface of the target.

In one embodiment, the directional ion beam can include ionized clusters of a dielectric material, which is deposited on surfaces of the semiconductor fins 30 that are not parallel to the lengthwise direction of the semiconductor fins 30 to form the dielectric material layer 56'. In this case, the dielectric material layer 56' includes a deposited dielectric material that is formed by de-ionizing the ionized gas clusters in the gas cluster ion beam. For example, the directional ion beam can include ions of a dielectric material such as silicon oxide, silicon nitride, silicon oxynitride, a dielectric metal oxide, a dielectric metal nitride, or a combination thereof. The dielectric material layer 56' includes a deionized dielectric material that is the same in composition as the dielectric material in the directional ion beam except for the deionization of the dielectric material. In one embodiment, the directional ion beam and the dielectric material layer 56' can include silicon oxide, silicon nitride, silicon oxynitride, a dielectric metal oxide, a dielectric metal nitride, or a combination thereof.

In another embodiment, the directional ion beam can include ionized clusters of a gas such as oxygen or nitrogen, which is implanted through surfaces of the semiconductor fins 30 that are not parallel to the lengthwise direction of the semiconductor fins 30 to form the dielectric material layer 56'. In this case, the dielectric material layer 56' includes a dielectric material that is formed by the combination of the implanted ionized gas clusters in the gas cluster ion beam and the semiconductor material in the semiconductor fins 30, and by deionization of the combined material. For example, the directional ion beam can include ions of a cluster of oxygen atoms or ions of a cluster of nitrogen atoms, and the dielectric material layer 56' is formed by conversion of surface portions of the semiconductor fins 30 into a dielectric material. The converted surface portions of the semiconductor fins 30 include surface portions of the semiconductor fins at the widthwise sidewalls of the semiconductor fins 30 and at the top surfaces of the semiconductor fins 30. In one embodiment, the directional ion beam can include oxygen and the dielectric material layer 56' can include silicon oxide. In another embodiment, the directional ion beam can include nitrogen and the dielectric material layer 56' can include silicon nitride.

In one embodiment, the directional ion beam can be angled relative to the vertical direction perpendicular to the top surfaces of the semiconductor fins 30 as illustrated in FIGS. 3A and 3B. In one embodiment, the directional ion beam deposition process can be performed in two steps. In the first step, the direction of the directional ion beam be selected that a first unit vector representing the direction of the directional ion beam includes a downward vertical component and a horizontal component within the plane of the lengthwise direction of the semiconductor fins 30. In the second step, the direction of the directional ion beam can be selected that a second unit vector representing the direction of the directional ion beam includes the same downward vertical component as the first unit vector, and a horizontal component that is the opposite of the horizontal component of the first unit vector.

Thus, the first unit vector and the second unit vector are within a vertical plane including the lengthwise direction of the semiconductor fins 30. Optionally, a third step in which the direction of the directional ion beam is along a downward vertical direction may be added prior to the first step, between the first step and the second step, or after the second step. Thus, the beam direction is contained within a vertical plane parallel to lengthwise sidewalls of the semiconductor fins 30 throughout each step of the directional ion beam process. All beam directions during the directional ion beam process can be contained within a vertical plane parallel to the lengthwise sidewalls of the semiconductor fins 30.

Methods of generating a gas cluster ion beam are known in the art, and can be found, for example, in U.S. Patent Application Publication No. 2002/0014407 to Allen et al. and U.S. Patent Application Publication No. 2001/0010835 to Akizuki et al.

In one embodiment, the dielectric material layer 56' can be a contiguous dielectric material layer that is formed on, and extends across, the widthwise sidewalls and top surfaces of the semiconductor fins 30 and sidewall surfaces and the top surfaces of the gate stacks (50, 52, 58). The directional ion beam deposits, on the lengthwise sidewalls of the semiconductor fins 30, no material, or lesser material than on the widthwise sidewalls of the semiconductor fins 30.

In one embodiment, the directional ion beam deposits no material on the lengthwise sidewalls of the semiconductor fins 30. In this case, all portions of the lengthwise sidewalls of the semiconductor fins 30 that are laterally spaced from the gate structures (50, 52, 58) by a greater distance than the thickness the dielectric material layer 56' on the sidewalls of the gate structures (50, 52, 58), are physically exposed after the directional ion beam deposition process.

In another embodiment, the directional ion beam deposits any material on the lengthwise sidewalls of the semiconductor fins 30, for example, due to a finite angular spread in the direction of the ion clusters. In this case, an isotropic etch such as a wet etch can be performed to remove the deposited material from the lengthwise sidewalls of the semiconductor fins 30. All portions of the lengthwise sidewalls of the semiconductor fins 30 that are laterally spaced from the gate structures (50, 52, 58) by a greater distance than the thickness the dielectric material layer 56' on the sidewalls of the gate structures (50, 52, 58), are physically exposed after the isotropic etch.

In one embodiment, the dielectric material layer 56' can include silicon nitride or silicon oxide. The thickness of each dielectric material layer 56', as measured at a widthwise sidewall of a semiconductor fin 30, can be in a range from 3 nm to 30 nm, although lesser and greater thicknesses can also be employed.

Referring to FIGS. 4A-4E, an anisotropic etch can be performed to remove horizontal portions of the dielectric material layer 56'. Remaining portions of the dielectric material layer 56' includes dielectric material portions 56 located on the widthwise sidewalls of the semiconductor fins 30 and gate spacer 59 formed on the sidewall of the gate electrodes 52. Each dielectric material portion 56 can contact the entirety of a widthwise sidewall of a semiconductor fin 30. A pair of gate spacers 59 contacts sidewalls of each gate structure (50, 52, 58) that straddles a semiconductor fin 30. The two gate spacers 59 contacting the same gate structure (50, 52, 58) are disjoined from each other, and are laterally spaced from each other by the lateral dimension of the gate structure (50, 52, 58). As used herein, two elements are disjoined from each other if there is no contiguous path that remains within, or on the surfaces of, the two elements and connects a point within one of the two elements and another point in another of the two elements. The gate spacers 59 can have the same composition as, and the same thickness as, the dielectric material portions 56. Widthwise sidewalls of the gate structures (50, 52, 58) can be physically exposed to the ambient in which the first exemplary structure is present.

Referring to FIGS. 5A-5E, ion implantation is performed to introduce electrical dopants into the semiconductor fins 30 (See FIGS. 4A-4D). The gate structures (50, 52, 58) and the gate spacers 59 can be employed as an ion implantation mask. Optionally, an additional ion implantation mask (not shown), such as a patterned photoresist layer, may be employed as an ion implantation mask in addition to the gate structures (50, 52, 58) and the gate spacers 59. If the semiconductor fins 30 include electrical dopants of a first conductivity type, ions of a second conductivity type that is the opposite of the first conductivity type can be implanted into unmasked portions of the semiconductor fins 30, i.e., portions that are not masked by an ion implantation mask. For example, the first conductivity type can be p-type and the second conductivity type can be n-type, or vice versa.

A fin active region 3A is formed in each implanted portion of the semiconductor fins 30. Each unimplanted portion of the semiconductor fins 30 constitutes a body region 3B. A p-n junction can be formed at the interfaces between each adjoining pair of a body region 3B and a fin active region 3A.

As used herein, an "active region" can be a source region or a drain region of a field effect transistor. As used herein, a "fin active region" refers to an active region located within a semiconductor fin. As used herein, a "fin source region" refers to a source region located within a semiconductor fin. As used herein, a "fin drain region" refers to a drain region located within a semiconductor fin.

Surfaces of each fin active region 3A can include a widthwise sidewall of the semiconductor fin (3A, 3B) and portions of a pair of lengthwise sidewalls of the semiconductor fin (3A, 3B). A dielectric material portion 56 can contact the entirety of each widthwise sidewall of the semiconductor fins (3A, 3B).

Optionally, dopants of the second conductivity type can be implanted into the source regions 3S and the drain regions 3D of the semiconductor fins (3S, 3D, 3B) employing the combination of the gate structures (50, 52, 58) and the gate spacers 59 as an implantation mask.

Referring to FIGS. 6A-6E, raised active regions 4A are formed on physically exposed semiconductor surfaces of the semiconductor fins (3A, 3B) by selective deposition of a semiconductor material. The selective deposition of the semiconductor material is performed while the dielectric material portions 56 are present on the widthwise sidewalls of the semiconductor fins (3A, 3B) and the gate spacers 59 are present on sidewalls of the gate stacks (50, 52, 58) that extend along the widthwise direction of the semiconductor fins (3A, 3B).

In one embodiment, the selective deposition of the semiconductor material can be performed by a selective epitaxy process. During the selective epitaxy process, the deposited semiconductor material grows from physically exposed semiconductor surfaces, i.e., the physically exposed portions of the lengthwise sidewalls and top surfaces of the fin active regions 3A, while the semiconductor material is not deposited on, and thus, does not grow from, dielectric surfaces such as the surfaces of the dielectric material portions 56, the gate spacers 59, and the shallow trench isolation layer 20.

A raised active region 4A can be formed directly on each fin active region 3A. As used herein, a "raised active region" refers to an active region (i.e., a source region or a drain region) that is located on, and outside, a semiconductor fin or a preexisting semiconductor material portion. In one embodiment, each portion of the raised active regions 4A can be epitaxially aligned to an underlying fin active region 3A. The raised active regions 4A can include the same semiconductor material as, or a semiconductor material different from, the semiconductor material of the fin active regions 3A.

In one embodiment, each raised active region 4A can include a pair of semiconductor material portions contacting sidewalls of a fin active region 3A and another semiconductor material portion contacting a top surface of the fin active region 3A. The pair of semiconductor material portions contacting the sidewalls of the fin active region 3A is located on the portions of a pair of lengthwise sidewalls of a semiconductor fin (3A, 3B) that do not contact a gate dielectric 50 or gate spacers 59. The semiconductor material portion of the raised active region 4A that is in contact with the top surface of the fin active region 3A laterally extends from a top edge of a dielectric material portion 56 to a bottom edge of a gate spacer 59.

In one embodiment, the raised active regions 4A can be formed with in-situ doping during the selective epitaxy process. Thus, each portion of the raised active regions 4A can be formed as doped semiconductor material portions. Alternatively, the raised active regions 4A can be formed as intrinsic semiconductor material portions and electrical dopants can be subsequently introduced into the raised active regions 4A to convert the raised active regions 4A into doped semiconductor material portions.

In one embodiment, the various semiconductor material portions of the raised active regions 4A can be formed with crystallographic facets. The crystallographic facets of the raised active regions 4A can be at a non-zero, non-orthogonal, angle with respect to adjoining surfaces of the raised active regions 4A. In one embodiment, the various raised active regions 4A on different semiconductor fins (3A, 3B) can remain disjoined from one another, i.e., not merged with one another.

Referring to FIGS. 7A-7E, a contact level dielectric layer 80 can be formed over the semiconductor fins (3A, 3B), the raised active regions 4A, the gate structures (50, 52, 58), the dielectric material portions 56, and the dielectric spacers 59. The contact level dielectric layer 80 includes a dielectric material such as silicon oxide, silicon nitride, silicon oxynitride, porous or non-porous organosilicate glass (OSG), or a combination thereof. The contact level dielectric layer 80 can be deposited, for example, by chemical vapor deposition. Optionally, the top surface of the contact level dielectric layer 80 can be planarized, for example, by chemical mechanical planarization.

The contact level dielectric layer 80 is in physical contact with the dielectric material portions 56 and the raised active regions 4A. The dielectric material of the contact level dielectric layer 80 can contact sidewalls of the gate stacks (50, 52, 58) that extend along the lengthwise direction of the semiconductor fins 30. In one embodiment, the dielectric material of the contact level dielectric layer 80 can contact a sidewall surface of the gate electrodes 52 that extend along the lengthwise direction of the semiconductor fins 30.

Various contact via structures (8A, 8G) are formed through the contact level dielectric layer 80 to provide electrical contact to various nodes of the fin field effect transistors. For example, active region contact via structures 8A provide electrical contact to the various raised active regions 4A and the fin active regions 3A, and gate contact via structures 8G provide electrical contact to the gate electrodes 52.

The first exemplary semiconductor structure includes at least a fin active region 3A located within a semiconductor fin (3A, 3B) that is located on a substrate 10. Surfaces of the fin active region 4A include a widthwise sidewall of the semiconductor fin (3A, 3B) and portions of a pair of lengthwise sidewalls of the semiconductor fin (3A, 3B). The first exemplary semiconductor structure includes a dielectric material portion 56 contacting the entirety of the widthwise sidewall, and a raised active region 4A including a pair of doped semiconductor material portions located on the portions of the pair of lengthwise sidewalls. The entirety of the pair of lengthwise sidewalls of the semiconductor fin (3A, 3B) can be in physical contact with a gate dielectric 50, a pair of gate spacers 59, or at least one raised active region including the raised active region 4A.

Referring to FIGS. 8A-8E, a second exemplary semiconductor structure according to an embodiment of the present disclosure can be derived from the first exemplary semiconductor structure of FIGS. 3A-3E by omitting the processing steps of FIGS. 4A-4E and by performing the processing steps of 5A-5E and 6A-6E. The dielectric material layer 56' is a contiguous dielectric material portion that contacts the widthwise sidewalls and top surfaces of the semiconductor fins (3A, 3B), the top surfaces of the gate stacks (50, 52, 58) and the sidewalls of the gate stacks (50, 52, 58) that extend along the widthwise direction of the semiconductor fins (3A, 3B), and the top surface of the shallow trench isolation layer 20. In one embodiment, openings in the dielectric material layer 56' may be present between a pair of semiconductor fins (3A, 3B) that are adjacent to each other along the lengthwise direction of the semiconductor fins (3A, 3B). In another embodiment, the entirety of the top surface of the shallow trench isolation layer 20 can contact the dielectric material layer 56'. Due to the presence of the dielectric material layer 56' on the top surface of the shallow trench isolation layer 20, the bottommost surface of the raised active regions 4A may be vertically spaced from the top surface of the shallow trench isolation layer 20 by the thickness of the dielectric material layer 56'.

Referring to FIGS. 9A-9E, the processing steps of FIGS. 7A-7E are performed to form a contact level dielectric layer 80 and various contact via structures (8A, 8G). The second exemplary semiconductor structure includes at least a fin active region 4A located within a semiconductor fin (3A, 3B) that is located on a substrate 10. Surfaces of the fin active region 3A include a widthwise sidewall of the semiconductor fin (3A, 3B) and portions of a pair of lengthwise sidewalls of the semiconductor fin (3A, 3B). The second exemplary semiconductor structure further includes a dielectric material layer 56', which is a dielectric material portion, contacting an entirety of the widthwise sidewall, a raised active region 4A including a pair of doped semiconductor material portions located on the portions of the pair of lengthwise sidewalls, and a contact level dielectric layer 80 in physical contact with the dielectric material portion and the raised active region 4A. In one embodiment, the contact level dielectric layer 80 can contact sidewalls of the gate stacks (50, 52, 58) that extend along the lengthwise direction of the semiconductor fins (3A, 3B).

In one embodiment, the dielectric material portion of the dielectric material layer 56' contiguously extends over, and physically contacts, a top surface of the fin active region 3A. In one embodiment, the second exemplary semiconductor structure can further include a gate electrode 52 straddling the semiconductor fin (3A, 3B). The dielectric material layer 56' can contiguously extend over the top surface of the gate electrode 52.

Referring to FIGS. 10A-10E, a third exemplary semiconductor structure according to an embodiment of the present disclosure can be derived from the first exemplary semiconductor structure of FIGS. 6A-6E by removing the dielectric material portions 56 and the gate spacers 59 selective to the raised active regions 4A, the semiconductor fins (3A, 3B), and the gate structures (50, 52, 58). The selective removal of the dielectric material portions 56 and the gate spacers 59 can be performed, for example, by an isotropic etch such as a wet etch. For example, if the dielectric material portions 56 and the gate spacers 59 include silicon oxide, a wet etch employing hydrofluoric acid can be employed. If the dielectric material portions 56 and the gate spacers 59 include silicon nitride, a wet etch employing hot phosphoric acid can be employed.

Referring to FIGS. 11A-11E, the processing steps of FIGS. 7A-7E are subsequently performed to form a contact level dielectric layer 80 and various contact via structures (8A, 8G). The third exemplary semiconductor structure includes at least a fin active region 4A located within a semiconductor fin (3A, 3B) that is located on a substrate 10. Surfaces of the fin active region 3A include a widthwise sidewall of the semiconductor fin (3A, 3B) and portions of a pair of lengthwise sidewalls of the semiconductor fin (3A, 3B). The third exemplary semiconductor structure further includes a gate stack (50, 52, 58) straddling the semiconductor fin (3A, 3B), and a raised active region 4A. The raised active region 4A includes a pair of doped semiconductor material portions located on the portions of the pair of lengthwise sidewalls and laterally spaced from the gate structure (50, 52, 58) by a distance that is the same as the thickness of the gate spacers 59 prior to removal. Additionally, the raised active region 4A includes another doped semiconductor material portion in contact with a top surface of the fin active region 3A. In one embodiment, the entirety of the raised active region 4A, i.e., the combination of the pair of doped semiconductor material portions and the doped semiconductor material portion overlying the fin active region 3A, can be laterally spaced from the gate stack (50, 52, 58) by a same lateral distance.

Further, the third exemplary semiconductor structure includes a contact level dielectric layer 80 in physical contact with the widthwise sidewall and surfaces of the pair of lengthwise sidewalls of the semiconductor fin (3A, 3B) that are located between the gate structure (50, 52, 58) and the raised active region 4A. In one embodiment, the contact level dielectric layer 80 can contact sidewalls of the gate stacks (50, 52, 58) that extend along the lengthwise direction of the semiconductor fins (3A, 3B). In one embodiment, the contact level dielectric layer 80 can be in physical contact with sidewalls of the gate electrode 52 within the gate stack (50, 52, 58).

Referring to FIGS. 12A-12E, a fourth exemplary semiconductor structure according to an embodiment of the present disclosure can be derived from the second exemplary semiconductor structure of FIGS. 8A-8E by removing the dielectric material layer 56' selective to the raised active regions 4A, the semiconductor fins (3A, 3B), and the gate structures (50, 52, 58). The selective removal of the dielectric material layer 56' can be performed, for example, by an isotropic etch such as a wet etch. For example, if the dielectric material layer 56' includes silicon oxide, a wet etch employing hydrofluoric acid can be employed. If the dielectric material layer 56' includes silicon nitride, a wet etch employing hot phosphoric acid can be employed.

Subsequently, the processing steps of FIGS. 7A-7E are performed to form a contact level dielectric layer 80 and various contact via structures (8A, 8G). The fourth exemplary semiconductor structure includes at least a fin active region 4A located within a semiconductor fin (3A, 3B) that is located on a substrate 10. Surfaces of the fin active region 3A include a widthwise sidewall of the semiconductor fin (3A, 3B) and portions of a pair of lengthwise sidewalls of the semiconductor fin (3A, 3B). The fourth exemplary semiconductor structure further includes a gate stack (50, 52, 58) straddling the semiconductor fin (3A, 3B), and a raised active region 4A. The raised active region 4A includes a pair of doped semiconductor material portions located on the portions of the pair of lengthwise sidewalls and laterally spaced from the gate structure (50, 52, 58) by a distance that is the same as the thickness of the gate spacers 59 prior to removal.

In one embodiment, the contact level dielectric layer 80 can contact surfaces of the raised active region 4A, all surfaces of the lengthwise sidewalls of the semiconductor fin (3A, 3B) that do not contact the gate dielectric 50 or the raised active region 4A, and all widthwise sidewalls of the semiconductor fin (3A, 3B). In one embodiment, the contact level dielectric layer 80 can contact sidewalls of the gate stacks (50, 52, 58) that extend along the lengthwise direction of the semiconductor fins (3A, 3B). In one embodiment, the contact level dielectric layer 80 can be in physical contact with sidewalls of the gate electrode 52 within the gate stack (50, 52, 58). In one embodiment, the entirety of the raised active region 4A, i.e., the pair of doped semiconductor material portions, can be laterally spaced from the gate stack (50, 52, 58) by a lateral distance, which is herein referred to as a lateral offset distance.

Referring to FIGS. 13A-13E, a fifth exemplary semiconductor structure according to an embodiment of the present disclosure can be derived from the first, second, third, or fourth exemplary semiconductor structure by adjusting the spacing between lengthwise sidewalls of semiconductor fins (3A, 3B) that neighbor each other along the widthwise direction of the semiconductor fins (3A, 3B). During a selective deposition process that forms the raised active regions 4A, various semiconductor material portions that grow from different semiconductor fins (3A, 3B) can merge along the widthwise direction of the semiconductor fins (3A, 3B) while not merging along the lengthwise direction of the semiconductor fins (3A, 3B) due to the presence of the dielectric material portion 56 (See FIGS. 6A-6E) or due to the presence of the dielectric material layer 56' (See FIGS. 8A-8E). Source regions in multiple semiconductor fins (3A, 3B) and drain regions in multiple semiconductor fins (3A, 3B) can be merged with one another to form a contiguous active region that contact multiple semiconductor fins (3A, 3B) that are laterally spaced from one another along the widthwise direction of the semiconductor fins (3A, 3B).

Figure 14:
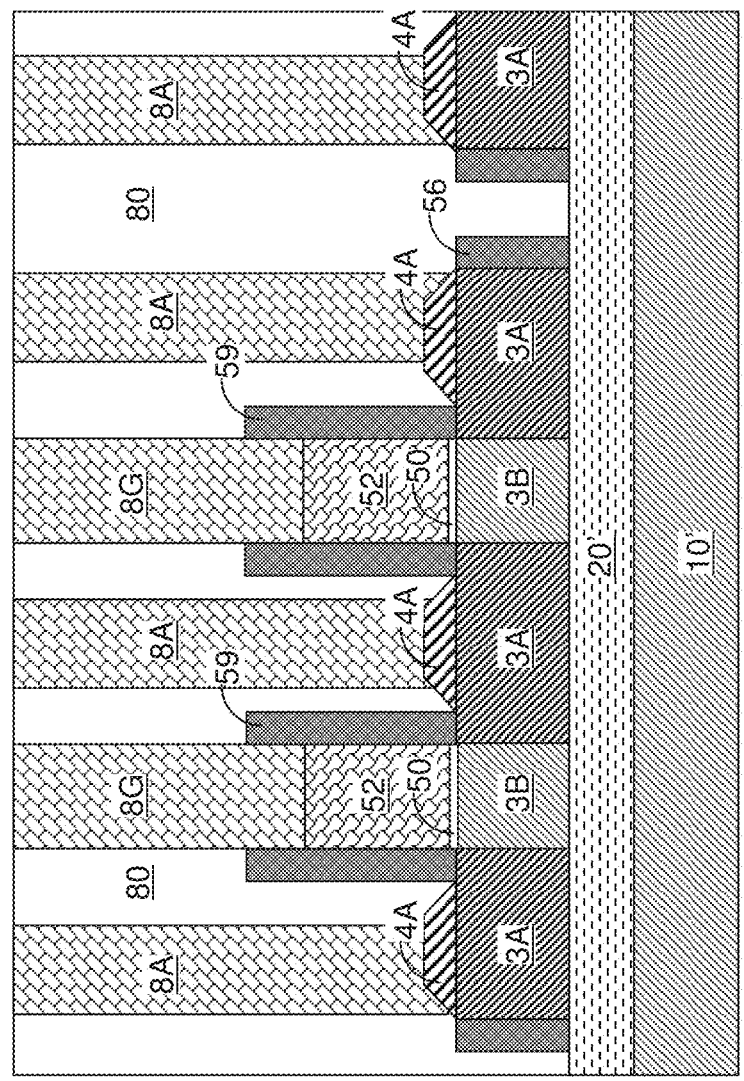
FIG. 14 is a vertical cross-sectional view of a sixth exemplary structure according to an embodiment of the present disclosure.

Referring to FIG. 14, a sixth exemplary semiconductor structure according to an embodiment of the present disclosure can be derived from the first, second, third, fourth, or fifth exemplary semiconductor structure by substituting a semiconductor-on-insulator (SOI) substrate for a bulk semiconductor substrate. In this case, a vertical stack of a buried insulator layer 20' and a handle substrate 10' can be present underneath the semiconductor fins (3A, 3B).

The various exemplary structures of the present disclosure can be employed to retard the growth of deposited semiconductor material during the selective deposition process that forms the raised active regions 4A along the lengthwise direction of the semiconductor fins (3A, 3B). Particularly, in combination with the facet formation on the surfaces of the raised active regions 4A, the presence of the dielectric material portion 56 or the dielectric material layer 56' (which is a contiguous dielectric material potion) prevents growth of the raised active regions along the lengthwise direction of the semiconductor fins (3A, 3B). Thus, electrical shorts between neighboring semiconductor fins (3A, 3B) that are laterally separated along the lengthwise direction of the semiconductor fins (3A, 3B) can be suppressed by the presence of the dielectric material portion 56 or the dielectric material layer 56' during the formation of the raised active regions 4A.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
    a fin active region located within a semiconductor fin that is located on a substrate, wherein surfaces of said fin active region include a widthwise sidewall of said semiconductor fin and portions of a pair of lengthwise sidewalls of said semiconductor fin;
    a contiguous dielectric material portion contacting an entirety of said widthwise sidewall of said semiconductor fin and extending over, and physically contacts, a top surface of said fin active region;
    a raised active region including a pair of doped semiconductor material portions located on said portions of said pair of lengthwise sidewalls; and
    a contact level dielectric layer in physical contact with said contiguous dielectric material portion and said raised active region.

2. The semiconductor structure of claim 1, further comprising a gate structure straddling said semiconductor fin, wherein said continuous dielectric material portion also extends over a top surface of said gate structure.

3. The semiconductor structure of claim 1, wherein said raised active region further includes another doped semiconductor material portion in contact with a top surface of said fin active region.

4. The semiconductor structure of claim 3, wherein said pair of doped semiconductor material portions and said another doped semiconductor material portion are laterally spaced from said gate structure by a same lateral distance.

5. The semiconductor structure of claim 1, further comprising at least one contact via structure located within said contact level dielectric layer.

6. The semiconductor structure of claim 5, wherein said at least one contact via structure comprises an active region contact via structure contacting said raised active region and said fin active region.

7. The semiconductor structure of claim 5, wherein said at least one contact via structure comprises a gate contact via structure contacting said gate structure.

8. The semiconductor structure of claim 2, further comprising a dielectric spacer located on sidewalls of said gate structure.

9. The semiconductor structure of claim 1, further comprising a shallow trench isolation layer located at a footprint of said semiconductor fin.

10. The semiconductor structure of claim 1, wherein said raised active region comprises a same semiconductor material as said semiconductor fin.

11. The semiconductor structure of claim 1, wherein said raised active region comprises a different semiconductor material than said semiconductor fin.

12. The semiconductor structure of claim 1, wherein said substrate includes a remaining portion of a bulk semiconductor substrate.

13. The semiconductor structure of claim 1, wherein said substrate comprises a buried insulator layer.

14. The semiconductor structure of claim 1, wherein said raised active region contains crystallographic facets.

15. The semiconductor structure of claim 2, wherein said a contact level dielectric layer has a topmost surface that is located above a topmost surface of said gate structure.

* * * * *